(12) United States Patent
Honda

(10) Patent No.: US 8,193,587 B2
(45) Date of Patent: Jun. 5, 2012

(54) MANUFACTURING METHOD OF SEMICONDUCTOR DEVICE, MANUFACTURING METHOD OF DISPLAY DEVICE, SEMICONDUCTOR DEVICE, DISPLAY DEVICE, AND ELECTRONIC DEVICE

(75) Inventor: Tatsuya Honda, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/881,480

(22) Filed: Sep. 14, 2010

(65) Prior Publication Data

US 2010/0327290 A1    Dec. 30, 2010

Related U.S. Application Data

(62) Division of application No. 12/078,093, filed on Mar. 27, 2008, now Pat. No. 7,799,620.

(30) Foreign Application Priority Data

May 17, 2007    (JP) ................................. 2007-131590

(51) Int. Cl.
    *H01L 27/12*    (2006.01)
(52) U.S. Cl. ................. 257/347; 438/149; 257/E21.122
(58) Field of Classification Search .................. 438/153, 438/154
    See application file for complete search history.

(56) References Cited

U.S. PATENT DOCUMENTS

| 5,744,824 | A | 4/1998 | Kousai et al. |
| 5,757,456 | A | 5/1998 | Yamazaki et al. |
| 5,766,977 | A | 6/1998 | Yamazaki |
| 5,834,327 | A | 11/1998 | Yamazaki et al. |
| 6,335,231 | B1 | 1/2002 | Yamazaki et al. |
| 7,244,990 | B2 | 7/2007 | Takafuji et al. |
| 7,262,464 | B2 | 8/2007 | Takafuji et al. |
| 7,508,034 | B2 | 3/2009 | Takafuji et al. |
| 2001/0025992 | A1* | 10/2001 | Nakajima et al. ............. 257/347 |
| 2004/0183133 | A1* | 9/2004 | Takafuji et al. ............... 257/347 |
| 2005/0173761 | A1* | 8/2005 | Takafuji et al. ............... 257/347 |

FOREIGN PATENT DOCUMENTS

| JP | 08-006053 | 1/1996 |
| JP | 2004-134675 | 4/2004 |
| JP | 2004-165600 | 6/2004 |

* cited by examiner

*Primary Examiner* — Ha Tran T Nguyen
*Assistant Examiner* — Shaka Scarlett
(74) *Attorney, Agent, or Firm* — Eric J. Robinson; Robinson Intellectual Property Law Office, P.C.

(57) ABSTRACT

A method for manufacturing a semiconductor device provided with a circuit capable of high speed operation while the manufacturing cost is reduced. A method for manufacturing a semiconductor device which includes forming an ion-doped layer at a predetermined depth from a surface of a single-crystal semiconductor substrate and forming a first insulating layer over the single-crystal semiconductor substrate; forming a second insulating layer over part of an insulating substrate and forming a non-single-crystal semiconductor layer over the second insulating layer; bonding the single-crystal semiconductor substrate to a region of the insulating substrate where the second insulating layer is not formed, with the first insulating layer interposed therebetween; and forming a single-crystal semiconductor layer over the insulating substrate by separating the single-crystal semiconductor substrate at the ion-doped layer which acts as a separation surface so that the ion-doped layer is separated from the insulating substrate.

20 Claims, 14 Drawing Sheets

PRIOR ART

MANUFACTURING METHOD OF SEMICONDUCTOR DEVICE, MANUFACTURING METHOD OF DISPLAY DEVICE, SEMICONDUCTOR DEVICE, DISPLAY DEVICE, AND ELECTRONIC DEVICE

BACKGROUND OF THE INVENTION

1. Field of the Invention

The present invention relates to methods for manufacturing a semiconductor device, methods for manufacturing a display device, semiconductor devices, display devices, and electronic devices.

2. Description of the Related Art

In recent years, flat panel displays such as liquid crystal display devices and electroluminescence (EL) display devices have attracted attention.

Driving methods of the flat panel displays include a passive matrix method and an active matrix method. An active matrix method has advantages over a passive matrix method in low power consumption, high definition, a large-sized substrate, and the like.

Here, a structural example of an active matrix display device is briefly described with reference to FIGS. 14A and 14B. FIG. 14A illustrates an example of a structure in which a driver circuit is provided using a tape automated bonding (TAB) method.

In FIG. 14A, a pixel portion 1401 in which pixels 1402 are arranged in matrix is formed over a substrate 1400 having an insulating surface. The pixels 1402 are arranged in matrix at intersections of scan lines extending from a scan line side input terminal 1403 and signal lines extending from a signal line side input terminal 1404. Each of the pixels in the pixel portion 1401 is provided with a switching element and a pixel electrode layer connected to the switching element. A typical example of the switching element is a thin film transistor (TFT). A gate electrode layer side of a TFT is connected to a scan line, and a source or drain side of the TFT is connected to a signal line. In addition, an integrated circuit (IC) 1451 included in a driver circuit is connected to a flexible printed circuit (FPC) 1450.

In a structure where a driver circuit is provided outside as in FIG. 14A, it is possible to use, as a driver circuit, an IC using a single-crystal silicon; therefore, a problem due to a speed of a driver circuit does not arise. However, when an IC is provided in this manner, the manufacturing cost cannot be reduced sufficiently because of necessity of preparing a display portion and an IC separately, necessity of a step of connecting the display portion and the IC, and the like. Further, there has been a problem in that a display device increases in size (particularly thickness) because of an IC.

Thus, in view of solution to the above-described problems, a method in which a pixel portion and a driver circuit are formed over the same substrate has been employed (for example, see Patent Document 1: Japanese Published Patent Application No. H8-6053). FIG. 14B illustrates an example of a structure in which a pixel portion and a driver circuit portion are formed over the same substrate.

In the case illustrated in FIG. 14B, non-single-crystal silicon such as amorphous silicon, microcrystalline silicon, or polycrystalline silicon is used as a semiconductor layer of a driver circuit 1460, similar to the pixel portion. However, even in a case where microcrystalline silicon or polycrystalline silicon as well as amorphous silicon is used, there is a problem in that characteristics thereof are incomparable to characteristics of single-crystal silicon. In particular, in a semiconductor layer which is used for a conventional display device where a driver circuit is integrated, it has been difficult to manufacture a TFT having characteristics (mobility, a sub-threshold swing (S value), and the like), which are necessary and sufficient. This has caused a big problem in manufacturing a semiconductor device where high speed operation is required, that is, a driver circuit.

SUMMARY OF THE INVENTION

In view of the above-described problems, one object of the present invention is to provide a method for manufacturing a semiconductor device provided with a circuit capable of high speed operation while the manufacturing cost is reduced. In addition, another object of the present invention is to provide a semiconductor device, particularly a display device, using the manufacturing method.

In the present invention, a driver circuit portion and a pixel portion are formed of semiconductor layers of different properties. Specifically, a driver circuit portion is formed of a single-crystal semiconductor layer, and a pixel portion is formed of a non-single-crystal semiconductor layer. Accordingly, a driver circuit having characteristics which are necessary and sufficient can be manufactured while the manufacturing cost is reduced.

One aspect of a method for manufacturing a semiconductor device of the present invention includes the steps of forming an ion-doped layer at a predetermined depth from a surface of a single-crystal semiconductor substrate and forming a first insulating layer over the single-crystal semiconductor substrate; forming a second insulating layer over part of an insulating substrate and forming a non-single-crystal semiconductor layer over the second insulating layer; bonding the single-crystal semiconductor substrate to a region of the insulating substrate where the second insulating layer is not formed, with the first insulating layer interposed therebetween; and forming a single-crystal semiconductor layer over the insulating substrate by separating the single-crystal semiconductor substrate at the ion-doped layer (separating the ion-doped layer from the insulating substrate, the ion-doped layer as a separation surface (may also be referred to as a cleavage plane)).

Another aspect of a method for manufacturing a semiconductor device of the present invention includes the steps of forming an ion-doped layer at a predetermined depth from a surface of a single-crystal semiconductor substrate and forming a first insulating layer over the single-crystal semiconductor substrate; forming a second insulating layer over part of an insulating substrate and forming a non-single-crystal semiconductor layer over the second insulating layer; bonding the single-crystal semiconductor substrate to a region of the insulating substrate where the second insulating layer is not formed, with the first insulating layer interposed therebetween; forming a single-crystal semiconductor layer over the insulating substrate by separating the single-crystal semiconductor substrate at the ion-doped layer; forming a circuit, where high speed operation is required, with the use of the single-crystal semiconductor layer over the insulating substrate; and forming a circuit, where no high speed operation is required, with the use of the non-single-crystal semiconductor layer over the insulating substrate. Here, a circuit where high speed operation is required refers to a circuit where driving at a certain frequency or more is required. As an example, the circuit refers to a circuit where an operation at a frequency of greater than or equal to 1 MHz is required. A semiconductor layer which is used is defined by a required frequency because a frequency, at which a switching element used for a circuit can operate, largely depends on a semiconductor material. A switching element which uses a single-crystal semiconductor material having high carrier mobility (about 500 cm$^2$/V·s in a case of electrons in single-crystal silicon) has high transmittance speed of a signal and is suitable for high frequency operation. On the other hand, a switching element which uses a non-single-crystal semiconductor material having low carrier mobility (about 0.6 cm$^2$/V·s in a case of electrons in amorphous silicon) has low transmittance speed of a signal and is not suitable for high frequency operation. Note that an upper limit of a frequency at which a switching element can operate also depends on a parameter other than the material (for example, a channel length or the like); therefore, it is difficult to uniformly define high speed operation by a certain frequency or more. A frequency is shown here in accordance with performance as a tentative standard, which is required for a driver circuit of a display device.

Another aspect of a method for manufacturing a display device of the present invention includes the steps of: forming an ion-doped layer at a predetermined depth from a surface of a single-crystal semiconductor substrate and forming a first insulating layer over the single-crystal semiconductor substrate; forming a second insulating layer over part of an insulating substrate and forming a non-single-crystal semiconductor layer over the second insulating layer; bonding the single-crystal semiconductor substrate to a region of the insulating substrate where the second insulating layer is not formed, with the first insulating layer interposed therebetween; forming a single-crystal semiconductor layer over the insulating substrate by separating the single-crystal semiconductor substrate at the ion-doped layer; forming a driver circuit with the use of the single-crystal semiconductor layer over the insulating substrate; and forming a circuit of a display portion (a pixel portion) with the use of the non-single-crystal semiconductor layer over the insulating substrate.

In the above-description, the first insulating layer or the second insulating layer may be formed in a stacked-layer structure of two or more layers. Alternatively, a portion where the first insulating layer is in contact with the single-crystal semiconductor layer may be formed using the same material as a portion where the second insulating layer is in contact with the non-single-crystal semiconductor layer. In particular, the portion where the first insulating layer is in contact with the single-crystal semiconductor layer and the portion where the second insulating layer is in contact with the non-single-crystal semiconductor layer are preferably formed in a stacked-layer structure of a silicon oxynitride layer and a silicon nitride oxide layer. Here, it is the silicon oxynitride layer that is in contact with the single-crystal semiconductor layer and the non-single-crystal semiconductor layer. In addition, a portion of the first insulating layer, which is in contact with the insulating substrate, is preferably formed of a silicon oxide layer. In particular, the silicon oxide layer may be formed by a chemical vapor deposition method with the use of organic silane.

In addition, in the above-description, the thickness of the single-crystal semiconductor layer is preferably made smaller than the thickness of the non-single-crystal semiconductor layer. Further, a sum of the thickness of the single-crystal semiconductor layer and the thickness of the first insulating layer is preferably made equivalent to a sum of the thickness of the non-single-crystal semiconductor layer and the thickness of the second insulating layer. Here, being "equivalent" is not limited being equivalent definitely. For example, a difference of about ±5% can be regarded as being equivalent.

Further, in the above-description, characteristics of the single-crystal semiconductor layer and the non-single-crystal semiconductor layer are preferably improved by performing laser light irradiation after the single-crystal semiconductor layer is formed over the insulating substrate. Note that the single-crystal semiconductor layer and the non-single-crystal semiconductor layer may be formed on one surface of the insulating substrate or on a different surface of the insulating substrate. Note that in the above-described structure, the insulating layers are formed after the ion-doped layer is formed; however, a structure in which the ion-doped layer is formed after the insulating layers are formed may also be employed.

One aspect of a semiconductor device of the present invention includes a first insulating layer and a second insulating layer over an insulating substrate; a single-crystal semiconductor layer over the first insulating layer; and a non-single-crystal semiconductor layer over the second insulating layer.

Another aspect of a semiconductor device of the present invention includes a first insulating layer and a second insulating layer over an insulating substrate; a single-crystal semiconductor layer over the first insulating layer; and a non-single-crystal semiconductor layer over the second insulating layer, where the single-crystal semiconductor layer is used to form a circuit where high speed operation is required, and where the non-single-crystal semiconductor layer is used to form a circuit where high speed operation is not required.

One aspect of a display device of the present invention includes a first insulating layer and a second insulating layer over an insulating substrate; a single-crystal semiconductor layer over the first insulating layer; and a non-single-crystal semiconductor layer over the second insulating layer, where the single-crystal semiconductor layer is used to form a driver circuit, and where the non-single-crystal semiconductor layer is used to form a circuit of a display portion (a pixel portion).

In the above-description, the first insulating layer or the second insulating layer may be formed in a stacked-layer structure of two or more layers. Alternatively, a portion where the first insulating layer is in contact with the single-crystal semiconductor layer may be formed using the same material as a portion where the second insulating layer is in contact with the non-single-crystal semiconductor layer. In particular, the portion where the first insulating layer is in contact with the single-crystal semiconductor layer and the portion where the second insulating layer is in contact with the non-single-crystal semiconductor layer are preferably formed in a stacked-layer structure of a silicon oxynitride layer and a silicon nitride oxide layer. Here, it is the silicon oxynitride layer that is in contact with the single-crystal semiconductor layer and the non-single-crystal semiconductor layer. In addition, a portion of the first insulating layer, which is in contact with the insulating substrate, is preferably formed of a silicon oxide layer. In particular, the silicon oxide layer may be formed by a chemical vapor deposition method with the use of organic silane.

In addition, in the above-description, the thickness of the single-crystal semiconductor layer is preferably made smaller than the thickness of the non-single-crystal semiconductor layer. Further, a sum of the thickness of the single-crystal semiconductor layer and the thickness of the first insulating layer is preferably made equivalent to a sum of the thickness of the non-single-crystal semiconductor layer and the thickness of the second insulating layer. Here, being "equivalent" is not limited being equivalent definitely. For example, within a difference of about ±5% can be regarded as being equivalent.

Further, various electronic devices can be provided using the above-described semiconductor devices and display device.

With the use of any of the manufacturing methods of the present invention, a driver circuit having characteristics which are necessary and sufficient can be manufactured. Accordingly, a complete monolithic semiconductor device can be manufactured; therefore, the manufacturing cost can be reduced. In addition, thickness which results from connecting an IC to outside can be reduced. Moreover, a semiconductor device in which an area of a frame portion is reduced can be manufactured. Further, according to the present invention, a high-performance semiconductor device can be manufactured using a substrate having low heat resistance such as a glass substrate.

Note that in the case of manufacturing a high definition display device, an interval between pixels is shortened; therefore, a capacitor of a pixel portion gets smaller. That is, characteristics required for a switching transistor of the pixel portion are reduced. In addition, in the case of manufacturing a large-sized display device, a pixel pitch becomes large; therefore, the size of a transistor can be increased. Also in this case, characteristics required for a switching transistor of the pixel portion are reduced. Therefore, sufficient performance can be obtained even when a switching transistor of the pixel portion is formed using an amorphous semiconductor or a non-single-crystal semiconductor.

In contrast to this, in a large-sized and high definition display device, a wiring which connects a driver circuit and a pixel gets longer; therefore, wiring resistance increases. That is, current which is applied to a driver circuit increases and thus the load increases. Further, as the number of pixels increases, the amount of data to be processed increases and the load of a driver circuit increases. That is, high performance is required for a transistor of a driver circuit portion.

In this manner, the present invention has a great advantageous effect particularly in large-sized and high definition display devices which use a combination of the non-single-crystal semiconductor layer and the single-crystal semiconductor layer so that the required characteristics can be completely satisfied.

DETAILED DESCRIPTION OF THE INVENTION

Figure 1A:
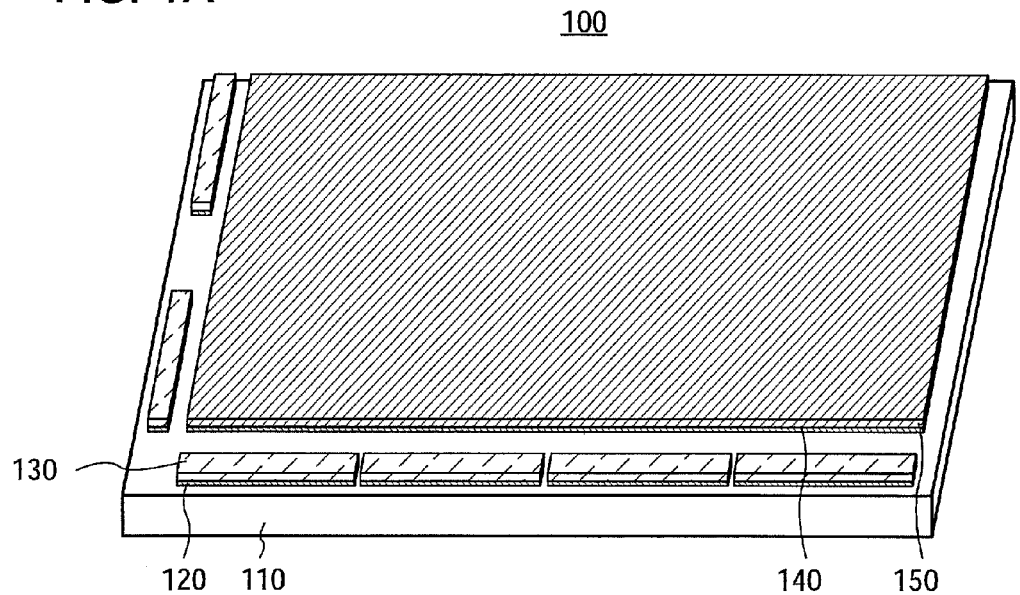
FIGS. 1A and 1B are each a perspective view of a semiconductor substrate of the present invention.

Embodiment modes of the present invention will be described hereinafter with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiment modes below. Note that in structures of the present invention to be described below, reference numerals denoting the same portions are used in common in different drawings.

Embodiment Mode 1

This embodiment mode will describe below a method for manufacturing a semiconductor substrate used in the present invention with reference to FIGS. 1A and 1B, FIGS. 2A and 2B, FIGS. 3A and 3B, FIGS. 4A to 4C, FIGS. 5A to 5C, FIGS. 6A to 6C, and FIGS. 7A and 7B. Note that a semiconductor substrate related to this embodiment mode is formed by transferring part thereof from a single-crystal semiconductor substrate to a different substrate (hereinafter referred to as a "base substrate").

Figure 1B:
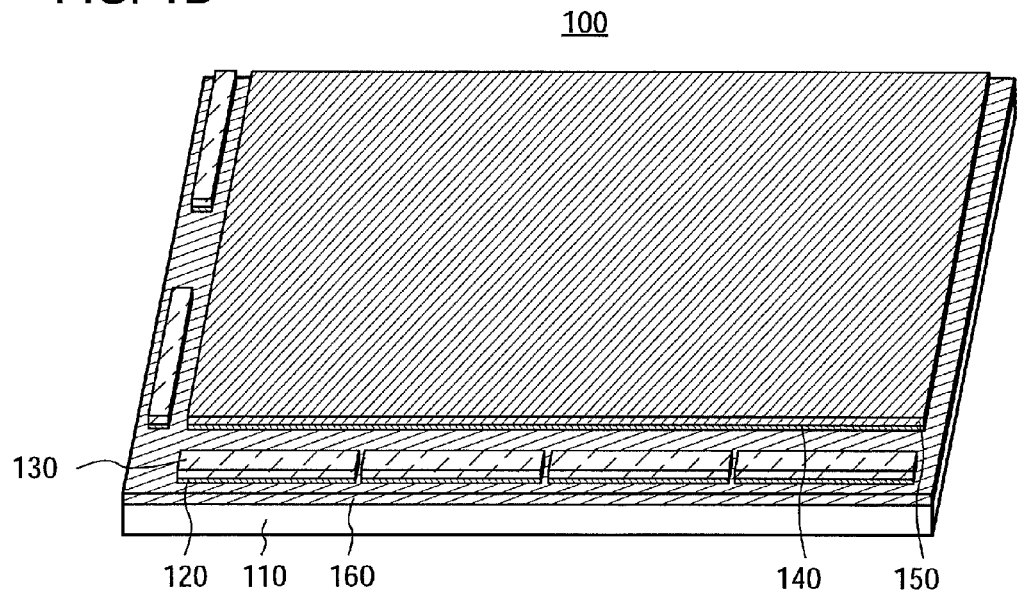

FIGS. 1A and 1B are each a perspective view of a semiconductor substrate used in the present invention. In addition, FIGS. 2A and 2B and FIGS. 3A and 3B are each a cross-sectional view of a semiconductor substrate used in the present invention.

Figure 2A:
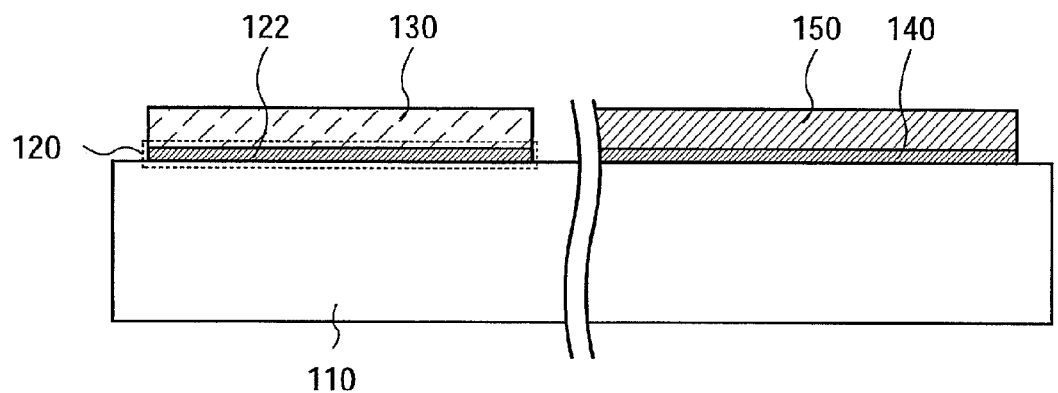
FIGS. 2A and 2B are each a cross-sectional view of a semiconductor substrate of the present invention.
Figure 2B:
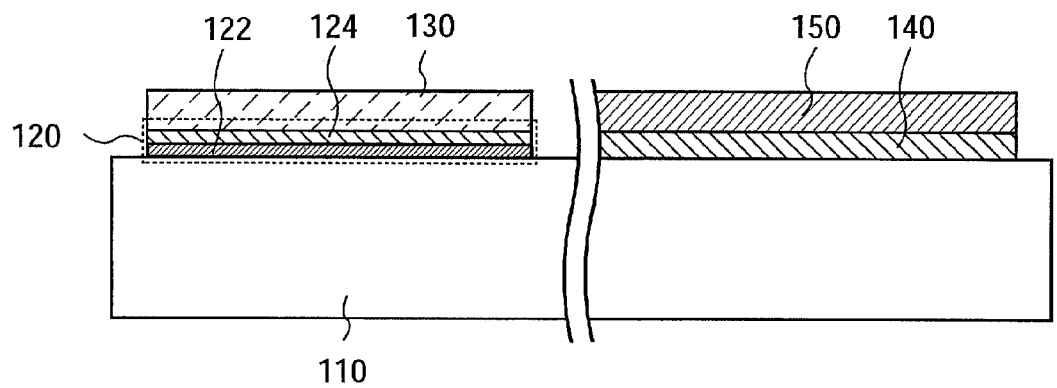

In FIGS. 1A, 2A, and 2B, a semiconductor substrate 100 has a structure in which, on one surface of a base substrate 110, a plurality of stacks in each of which insulating layers 120 and single-crystal semiconductor layers 130 are sequentially stacked are provided, and an insulating layer 140 and a non-single-crystal semiconductor layer 150 are sequentially stacked. The single-crystal semiconductor layers 130 and the non-single-crystal semiconductor layer 150 are provided over the base substrate 110 with the insulating layers 120 and the insulating layer 140 interposed therebetween, respectively. That is, the plurality of single-crystal semiconductor layers 130 and the non-single-crystal semiconductor layer 150 are provided over one base substrate 110, whereby one semiconductor substrate 100 is formed. Note that FIGS. 1A and 1B, FIGS. 2A and 2B, and FIGS. 3A and 3B each illustrate, for convenience, only a structure in the case where one display device is manufactured from one semiconductor substrate 100; however, the present invention should not be interpreted as being limited thereto.

As the single-crystal semiconductor layers 130, single-crystal silicon is typically applied. Alternatively, single-crystal germanium or a compound semiconductor (single crystal) such as gallium arsenide or indium phosphide can be applied.

The shape of the single-crystal semiconductor layers 130 is not particularly limited. However, the single-crystal semiconductor layers 130 are easily processed when they are rectangular (including a square) in shape and thus can be bonded to the base substrate 110 with high integration, which is preferable.

For the base substrate 110, a substrate having an insulating surface or an insulating substrate is used. Specifically, any of a variety of glass substrates which are used in the electronics industry such as aluminosilicate glass substrates, aluminoborosilicate glass substrates, and barium borosilicate glass substrates; quartz substrate; a ceramic substrate; a sapphire substrate; or the like can be used. A glass substrate is preferably used, and a mother glass substrate having a large area can be used, such as a so-called sixth generation substrate (1500 mm×1850 mm), a so-called seventh generation substrate (1870 mm×2200 mm), and a so-called eighth generation substrate (2200 mm×2400 mm), for example. A mother glass substrate having a large area is used as the base substrate 110, so that the area of the semiconductor substrate can be enlarged. In this embodiment mode, the case where one display device is manufactured from one base substrate is shown; however, in the case where a plurality of display devices are manufactured from one base substrate (the case of obtaining a number of panels from one substrate), the display devices may be manufactured by adjusting the size of the single-crystal semiconductor layers 130 and the non-single-crystal semiconductor layer 150, as appropriate.

The insulating layer 120 is provided between the base substrate 110 and the single-crystal semiconductor layer 130. The insulating layer 120 may have a single-layer structure or a stacked-layer structure; however, the surface bonded to the base substrate 110 (hereinafter also referred to as a "bonding surface") is made to have a smooth surface and a hydrophilic surface.

FIG. 2A illustrates an example in which a bonding layer 122 is formed as the insulating layer 120. As the bonding layer 122 which can have a smooth surface and a hydrophilic surface, a silicon oxide layer is suitable. In particular, a silicon oxide layer which is manufactured by a chemical vapor deposition method with the use of organic silane is preferable. As organic silane, a compound containing silicon such as tetraethoxysilane (abbreviation: TEOS) (chemical formula: $Si(OC_2H_5)_4$), tetramethylsilane ($Si(CH_3)_4$), trimethylsilane (($CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The bonding layer 122 which has a smooth surface and a hydrophilic surface is preferably provided in a thickness range of 5 to 500 nm. When the bonding layer 122 is provided with a thickness within the above range, a rough surface on which a film to be formed can be smoothed and the smoothness of the surface of the film which has grown can be secured as well. In addition, defective bonding between the bonding layer 122 and the substrate for bonding (the base substrate 110 in FIG. 2A) can be reduced. Note that a silicon oxide layer similar to the bonding layer 122 may also be provided over the base substrate 110. In boding the single-crystal semiconductor layer 130 to the base substrate 110 which is a substrate having an insulating surface or an insulating substrate, a bonding layer formed of a silicon oxide layer which is deposited using organic silane as a raw material is preferably provided on either one or both of surfaces which form a bond, so that a firm bond can be formed.

FIG. 2B illustrates an example in which the insulating layer 120 has a stacked-layer structure. Specifically, FIG. 2B illustrates an example in which a stacked-layer structure of the bonding layer 122 and a nitrogen-containing insulating layer 124 is formed as the insulating layer 120. Note that the nitrogen-containing insulating layer 124 is provided between the single-crystal semiconductor layer 130 and the bonding layer 122 in the structure so that the bonding layer 122 is formed on the bonding surface to the base substrate 110. The nitrogen-containing insulating layer 124 is formed to have a single-layer structure or a stacked-layer structure with the use of a silicon nitride layer, a silicon nitride oxide layer ($SiN_xO_y$: x>y), a silicon oxynitride layer ($SiO_xN_y$: x>y), or the like. For example, a silicon oxynitride layer and a silicon nitride oxide layer are stacked from the single-crystal semiconductor layer 130 side, so that the nitrogen-containing insulating layer 124 can be formed.

Here, in the case where a silicon nitride oxide layer is formed to be in contact with the single-crystal semiconductor layer 130, there is a problem in that characteristics of the single-crystal semiconductor layer deteriorate by stress. In addition, from the point of view of preventing diffusion of mobile ions, moisture, or the like, it is preferable to provide a silicon nitride oxide layer. That is, as in the above-described example, it is preferable to stack a silicon oxynitride layer and a silicon nitride oxide layer from the single-crystal semiconductor layer 130 side to have the nitrogen-containing insulating layer 124. Note that the nitrogen-containing insulating layer 124 is provided to prevent diffusion of impurities such as mobile ions or moisture into the single-crystal semiconductor layer 130, and the bonding layer 122 is provided to form a bond to the base substrate 110. In this regard, the respective purposes are different. In addition, the above-described structure is just an example and a structure in which the single-crystal semiconductor layer 130 and a silicon nitride oxide layer are provided in contact with each other is not excluded.

Note that the insulating layer 140 which is provided under the non-single-crystal semiconductor layer 150 is not limited to having the same structure as the insulating layer 120 which is provided under the single-crystal semiconductor layer 130. However, as illustrated in FIGS. 2A and 2B, at least a material in contact with the non-single-crystal semiconductor layer 150 and a material in contact with the single-crystal semiconductor layer 130 are preferably the same. The materials in contact are the same, so that etching characteristics of the non-single-crystal semiconductor layer 150 and the single-crystal semiconductor layer 130 in subsequent patterning can be the same.

Note that a silicon oxynitride film means a film that contains more oxygen than nitrogen and includes, for example, oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, a silicon nitride oxide film means a film that contains more nitrogen than oxygen and includes, for example, oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that the above ranges are the cases where measurements are performed using Rutherford backscattering spectrometry (RBS) and hydrogen forward scattering (HFS). Total percentages of the constituent elements does not exceed 100 atomic %.

Figure 3A:
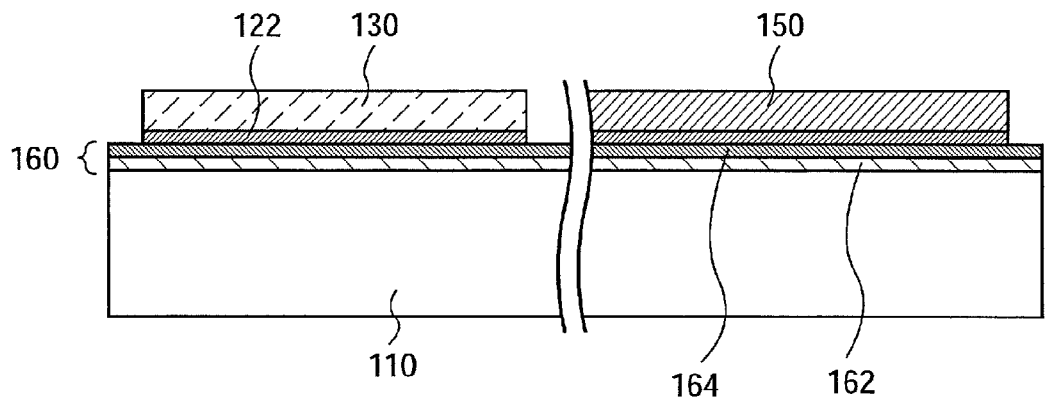
FIGS. 3A and 3B are each a cross-sectional view of a semiconductor substrate of the present invention.
Figure 3B:
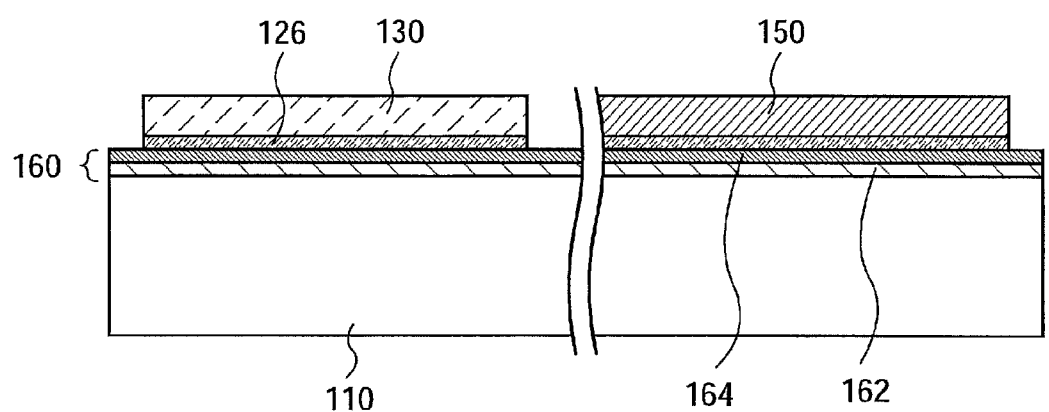

FIGS. 1B, 3A, and 3B each illustrate an example in which an insulating layer 160 including a bonding layer 164 is formed over the base substrate 110. The insulating layer 160 may have a single-layer structure or a stacked-layer structure; however, a bonding surface to the single-crystal semiconductor layer 130 is made to have a smooth surface and a hydrophilic surface. Note that it is preferable to provide a barrier layer 162 between the base substrate 110 and the bonding layer 164 in order to prevent diffusion of mobile ions of alkali metal or alkaline earth metal from a glass substrate which is used as the base substrate 110.

FIG. 3A illustrates an example in which a stacked-layer structure of a barrier layer 162 and a bonding layer 164 is formed as the insulating layer 160. As the bonding layer 164, a silicon oxide layer which is similar to the bonding layer 122 may be provided. In addition, the single-crystal semiconductor layer 130 may be provided with the bonding layer, as appropriate. FIG. 3A illustrates an example in which the single-crystal semiconductor layer 130 is also provided with the bonding layer 122. Since the bonding layers are bonded to each other in bonding the base substrate 110 and the single-crystal semiconductor layer 130 by having such a structure, a firmer bond can be formed. The barrier layer 162 is formed in a single-layer structure or a stacked-layer structure with the use of a silicon oxide layer, a silicon nitride layer, a silicon oxynitride layer, or a silicon nitride oxide layer. The barrier layer 162 is preferably formed using a nitrogen-containing insulating layer.

FIG. 3B illustrates an example in which the base substrate 110 is provided with a bonding layer 164. Specifically, a stacked-layer structure of the barrier layer 162 and the bonding layer 164 is provided over the base substrate 110 as the insulating layer 160. In addition, the single-crystal semiconductor layer 130 is provided with a silicon oxide layer 126. In boding the single-crystal semiconductor layer 130 to the base substrate 110, the silicon oxide layer 126 forms a bond to the bonding layer 164. The silicon oxide layer 126 is preferably formed by a thermal oxidation method. In addition, chemical oxide can also be used as the silicon oxide layer 126. Chemical oxide can be formed by processing a single-crystal semiconductor substrate surface with an ozone-containing solution, for example. Chemical oxide is preferable because it is formed in reflection of favorable planarity of a single-crystal semiconductor substrate surface.

Note that the insulating layer 140 which is provided under the non-single-crystal semiconductor layer 150 is not limited to having the same structure as the bonding layer 122 or the silicon oxide layer 126 which is provided under the single-crystal semiconductor layer 130. However, as illustrated in FIGS. 2A and 2B, at least a material in contact with the non-single-crystal semiconductor layer 150 and a material in contact with the single-crystal semiconductor layer 130 are preferably the same. The materials to be in contact are the same, so that etching characteristics of the non-single-crystal semiconductor layer 150 and the single-crystal semiconductor layer 130 in subsequent patterning can be the same.

Next, a method for manufacturing a semiconductor substrate is described. Here, an example of a method for manufacturing a semiconductor substrate which is illustrated in FIG. 2B is described with reference to FIGS. 4A to 4C, FIGS. 5A to 5C, FIGS. 6A to 6C, and FIGS. 7A and 7B. Note that it is needless to say that the semiconductor substrate illustrated in any of FIGS. 2A, 3A, 3B, and the like can also be manufactured similarly.

Figure 4A:
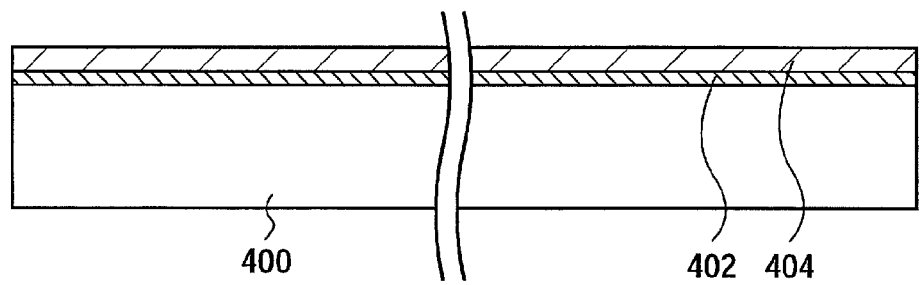
FIGS. 4A to 4C are cross-sectional views illustrating a manufacturing process of a semiconductor substrate of the present invention.

First, as illustrated in FIG. 4A, an insulating layer 402 is formed over a base substrate 400. As the base substrate 400, the above-described substrate can be used. In addition, a substrate formed from a synthetic resin having flexibility such as plastic typified by PET, PES, or PEN or acrylic can also be used.

The insulating layer 402 is provided to prevent alkali metal or alkaline earth metal contained in the base substrate 400 from diffusing into a semiconductor layer and adversely affecting characteristics of a semiconductor element. Thus, an insulating material such as silicon nitride or nitrogen-containing silicon oxide which can suppress diffusion of alkali metal or alkaline earth metal into a semiconductor layer is preferably used to form the insulating layer 402. In this embodiment mode, a nitrogen-containing silicon oxide film is formed by a plasma CVD method to have a thickness of greater than or equal to 10 nm and less than or equal to 400 nm (preferably a thickness of greater than or equal to 50 nm and less than or equal to 300 nm).

Next, a semiconductor layer 404 is formed over the insulating layer 402. The thickness of the semiconductor layer 404 is set to be greater than or equal to 25 nm and less than or equal to 100 nm (preferably greater than or equal to 30 nm and less than or equal to 60 nm). Note that the semiconductor layer 404 may be formed of an amorphous semiconductor or a polycrystalline semiconductor. Further, silicon germanium (SiGe) or the like as well as silicon (Si) can be used as a semiconductor.

Figure 4B:
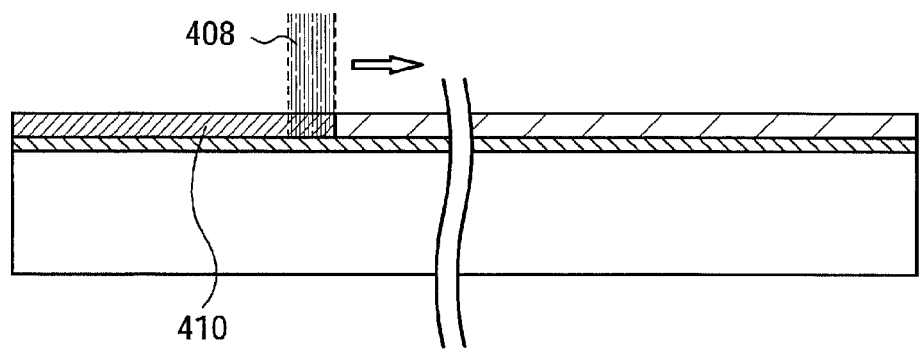

Next, as illustrated in FIG. 4B, the semiconductor layer 404 is irradiated with laser light 408 to be crystallized. In such a case where laser crystallization is performed as in this embodiment mode, a step of heat treatment at 500° C. for 1 hour may be added before a laser crystallization step in order to increase resistance of the semiconductor layer 404 against the laser.

As to the laser crystallization step, a continuous-wave laser (a CW laser), a pseudo-CW laser (a pulsed laser, a repetition rate of which is greater than or equal to 10 MHz, preferably greater than or equal to 80 MHz), or the like can be used, for example.

Specifically, as the CW laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a helium cadmium laser, and the like can be given.

As the pseudo-CW laser, a pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, and a gold vapor laser can be given.

Such a pulsed laser shows the same advantageous effect as a CW laser as the repetition rate is increased.

For example, in the case of using a solid-state laser capable of continuous oscillation, crystals with a large grain size can be obtained by irradiation with a laser beam having a second harmonic to a fourth harmonic. Typically, a second harmonic (532 nm) or a third harmonic (355 nm) of a YAG laser (fundamental wave: 1064 nm) can be used. The energy density may be about greater than or equal to 0.01 $MW/cm^2$ and less than or equal to 100 $MW/cm^2$ (preferably greater than or equal to 0.1 $MW/cm^2$ and less than or equal to 10 $MW/cm^2$).

By the above-described laser beam irradiation onto the semiconductor layer 404, a crystalline semiconductor layer 410 (or a non-single-crystal semiconductor layer) having improved crystallinity is formed.

Note that an example in which the crystalline semiconductor layer 410 is formed by laser light irradiation is shown in this embodiment mode; however, the present invention should not be interpreted as being limited thereto. In order to simplify the steps, the semiconductor layer 404 may be formed without being subjected to the crystallization step.

Figure 4C:
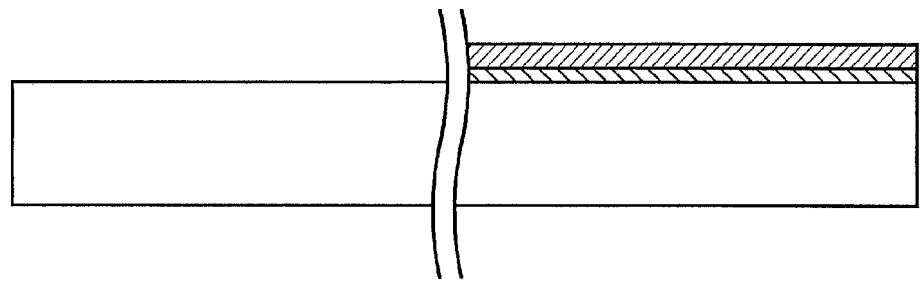

Next, as illustrated in FIG. 4C, the crystalline semiconductor layer 410 is selectively etched and the insulating layer 402 is further etched to partially expose the surface of the base substrate. In etching the crystalline semiconductor layer 410, an island-like semiconductor layer which forms a subsequent pixel TFT may be formed. Through the above-described steps, the crystalline semiconductor layer 410 (or a non-single-crystal semiconductor layer) is formed over the base substrate 400.

Next, a single-crystal semiconductor layer is formed. First, a single-crystal semiconductor substrate 500 is prepared (see FIGS. 5A and 6A). As the single-crystal semiconductor substrate 500, a silicon substrate, a germanium substrate, or a compound semiconductor substrate of gallium arsenide, indium phosphide, or the like can be used. As silicon substrates, substrates which are 5 inches (125 mm) in diameter, 6 inches (150 mm) in diameter, 8 inches (200 mm) in diameter, and 12 inches (300 mm) in diameter are typical, and most of such substrates are circular. Alternatively, such substrates which are processed into rectangular shapes may be used. In addition, the thickness of the single-crystal semiconductor substrate 500 can be selected up to about 1.5 mm, as appropriate.

Figure 5A:
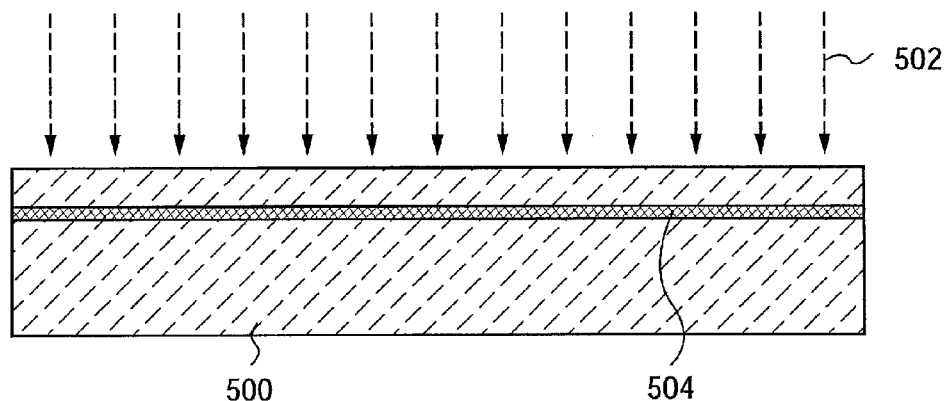
FIGS. 5A to 5C are cross-sectional views illustrating a manufacturing process of a semiconductor substrate of the present invention.
Figure 6A:
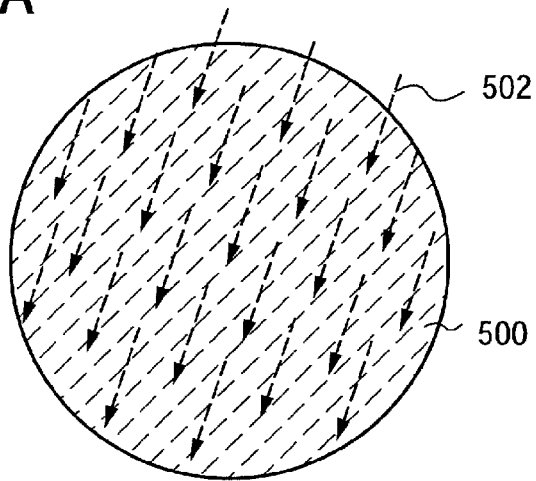
FIGS. 6A to 6C are views illustrating a manufacturing process of a semiconductor substrate of the present invention.

Next, ions 502 which are accelerated by an electric field are introduced from the surface of the single-crystal semiconductor substrate 500 so as to be implanted at a predetermined depth, so that an ion-doped layer 504 (can also be simply referred to as a damaged region) is formed (see FIGS. 5A and 6A). Here, introduction of ions refers to irradiation of an object with ions which are accelerated by an electric field. Accordingly, a region where a composition, atomic arrangement, or the like of the object is changed (a damaged region) can be formed at a predetermined depth from the surface of the object. Note that the above-described damaged region is particularly referred to as an ion-doped layer in this embodiment mode because ions are introduced with an ion doping apparatus. However, "introduction of ions with an ion doping apparatus", which is described here, has a feature in that ions are introduced with a proportion of $H_3^+$ ions increased, without ions being separated by mass; therefore, another method having such a feature may be used. In other words, an "ion-doped layer" should not be interpreted as being limited to an ion-doped layer formed with an ion doping apparatus. Note that a method using an ion implantation apparatus is given as a method for introducing ions which are separated by mass. Ion introduction with an ion doping apparatus can increase ion introduction efficiency as compared with a case where ions are introduced with an ion implantation apparatus. Therefore, it can be said that ion introduction with an ion doping apparatus is preferable.

Figure 7A:
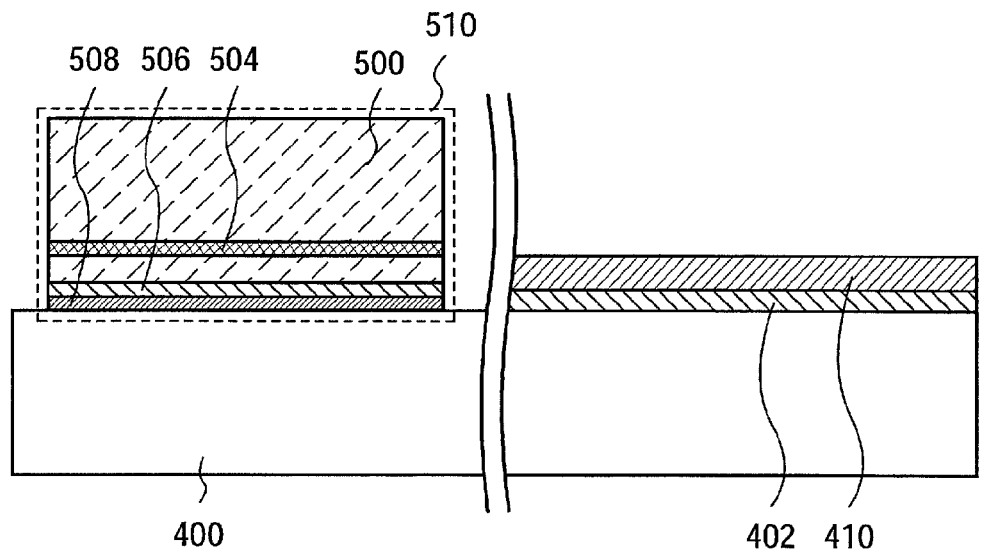
FIGS. 7A and 7B are cross-sectional views illustrating a manufacturing process of a semiconductor substrate of the present invention.
Figure 7B:
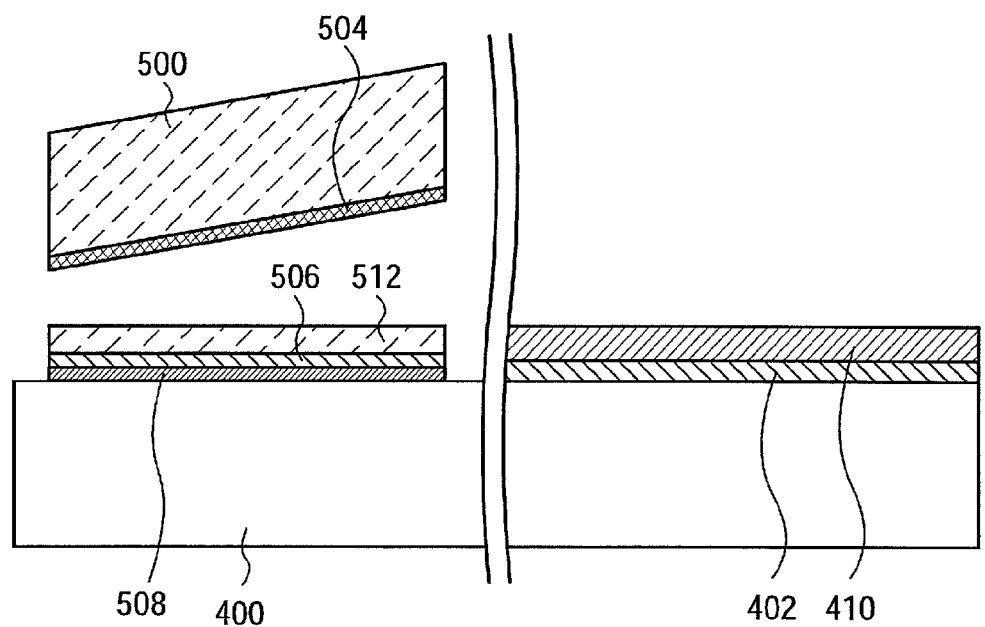

The ions 502 are introduced to the single-crystal semiconductor substrate 500 in consideration of a thickness of a single-crystal semiconductor layer 512 which will be formed later over the base substrate 400 (FIG. 7B). A single-crystal semiconductor layer 512 preferably has a thickness of 5 to 500 nm, more preferably 10 to 200 nm. Note that it is preferable to form the ion-doped layer 504 so that the thickness of the single-crystal semiconductor layer 512 is reduced, in order to further improve characteristics of the single-crystal semiconductor layer 512. Specifically, the ion-doped layer 504 is formed so that the thickness of the single-crystal semiconductor layer 512 is smaller than that of the crystalline semiconductor layer 410 (or a non-single-crystal semiconductor layer). Reduction in thickness can suppress a short-channel effect which is resulted from high response speed. In addition, parasitic capacitance can be reduced. Note that the crystalline semiconductor layer 410 (or a non-single-crystal semiconductor layer) may be formed with a thickness at which high yield can be obtained because the crystalline semiconductor layer 410 (or a non-single-crystal semiconductor layer) is not required to have such characteristics as those of the single-crystal semiconductor layer 512.

As the ions 502, it is preferable to use ion species which are generated by plasma activation of a source gas selected from hydrogen, helium, or a halogen element. In the case of introducing hydrogen ions, when a proportion of $H_3^+$ ions is raised in generating $H^+$, $H_2^+$, and $H_3^+$ ions, introduction efficiency of the ions can be increased and thus the introduction time can be shortened, which is preferable. A single-crystal semiconductor layer 512 can be easily separated by having such a structure.

Note that there is a case where the ions 502 are introduced under a high dosage condition in order to form the ion-doped layer 504 at a predetermined depth. In this case, the surface of the single-crystal semiconductor substrate 500 is roughed depending on the condition. Therefore, a silicon nitride layer, a silicon nitride oxide layer, or the like may be provided with a thickness in a range of about greater than or equal to 50 nm and less than or equal to 200 nm as a protective layer on the surface of the single-crystal semiconductor substrate 500.

Figure 5B:
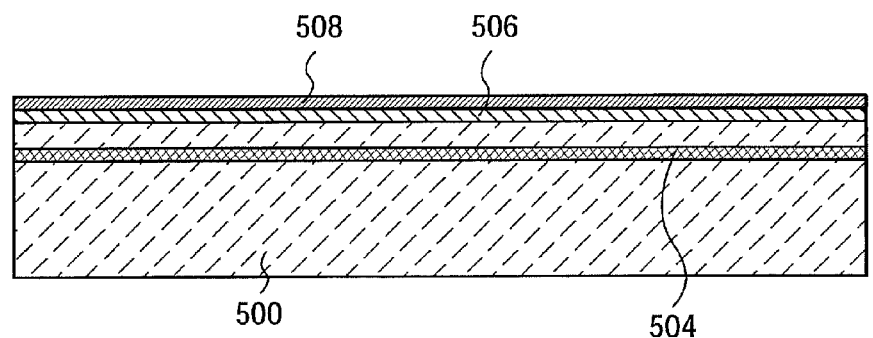
Figure 6B:
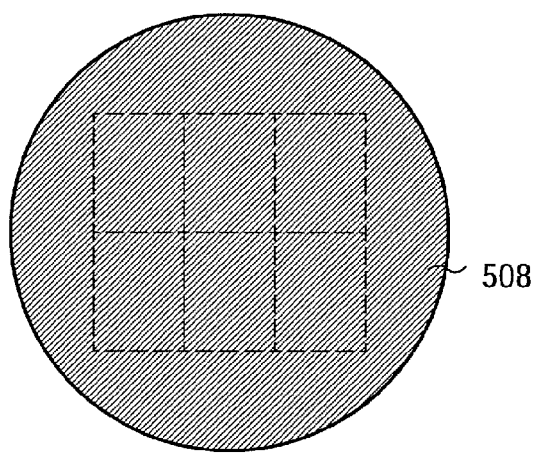

Next, after an insulating layer 506 is formed over the single-crystal semiconductor substrate 500, a bonding layer 508 is formed (see FIGS. 5B and 6B). It is preferable to form the insulating layer 506 from the same material as the insulating layer 402; however, the material thereof is not limited thereto. Note that the insulating layer 506 and the insulating layer 402 are formed from the same material, so that etching selectivity can be sufficiently secured. That is, even in a case where the thickness of the crystalline semiconductor layer 410 (or a non-single-crystal semiconductor layer) is different from that of a single-crystal semiconductor layer 512 which will be formed later, the single-crystal semiconductor layer 512 and the crystalline semiconductor layer 410 (or a non-single-crystal semiconductor layer) can be patterned by being etched at the same time. As an example of the insulating layer 506 and the insulating layer 402, a stacked-layer structure of a silicon oxynitride layer and a silicon nitride oxide layer may be used. As long as a structure in which a silicon oxynitride layer is provided in contact with a single-crystal semiconductor layer 512 and the crystalline semiconductor layer 410 (or a non-single-crystal semiconductor layer) and a silicon oxynitride layer and a silicon nitride oxide layer are stacked, there is no problem of decrease in characteristics of a single-crystal semiconductor layer 512 and the crystalline semiconductor layer 410 (or a non-single-crystal semiconductor layer) by stress, diffusion of impurities such as movable ions or moisture can be prevented, and further etching selectivity can be sufficiently secured.

In this embodiment mode, a nitrogen-containing silicon oxide film is formed by a plasma CVD method as the insulating layer 506. The bonding layer 508 is formed on the surface of the single-crystal semiconductor substrate 500, which forms a bond to the base substrate. As the bonding layer 508 which is formed here, as described above, a silicon oxide layer which is formed by a chemical vapor deposition method with the use of organic silane as a source gas is preferable. Alternatively, a silicon oxide layer which is formed by a chemical vapor deposition method with the use of silane as a source gas can also be applied. In film formation by a chemical vapor deposition method, a temperature about at which degassing does not occur from the ion-doped layer 504 which is formed in the single-crystal semiconductor substrate 500, for example, a temperature of greater than or equal to 350° C. is applied. Note that a heat treatment temperature which is higher than a film formation temperature by a chemical vapor deposition method is applied to heat treatment for separating a single-crystal semiconductor layer 512 from the single-crystal semiconductor substrate 500.

Note that the insulating layer 506 and the like are preferably formed so that the sum of the thickness of a single-crystal semiconductor layer 512 to be formed later by separation, the insulating layer 506, and the bonding layer 508 is made equivalent to the sum of the thickness of the crystalline-semiconductor layer 410 (or a non-single-crystal semiconductor layer) and the insulating layer 402. When the formation is performed so that the sums of the thicknesses are equivalent, disconnection or the like of a wiring can be reduced. Further, making the sums of the thicknesses equivalent is effective in that favorable manufacturing process can be realized.

Figure 5C:
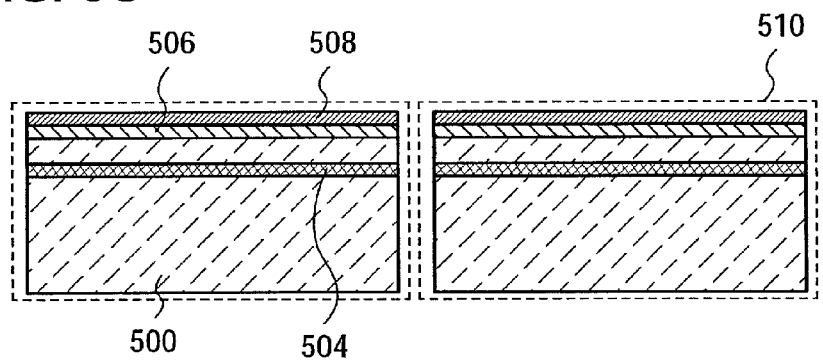
Figure 6C:
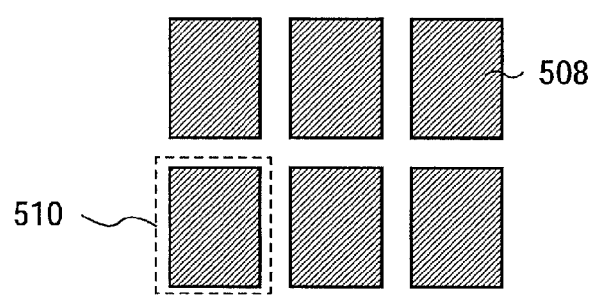

Next, the single-crystal semiconductor substrate 500 is processed into a desired size and shape (see FIGS. 5C and 6C). FIG. 6C illustrates an example in which the single-crystal semiconductor substrate 500 is circular and is divided to form a rectangular single-crystal semiconductor substrate 510. In this case, the insulating layer 506, the bonding layer 508, and the ion-doped layer 504 are also divided. That is, the single-crystal semiconductor substrate 510 having a desired size and shape, in which the ion-doped layer 504 is formed at a predetermined depth and the bonding layer 508 is formed on the surface (the bonding surface to the base substrate 400), is obtained.

The rectangular single-crystal semiconductor substrate 510 can be obtained in a desired size, and the size corresponds to the size of a driver circuit here. The size of the driver circuit may be selected as appropriate depending on the area which is required for the driver circuit. When the single-crystal semiconductor substrate has a rectangular shape, processing in a subsequent manufacturing process is facilitated and further the rectangular single-crystal semiconductor substrate 510 can be efficiently cut off from the single-crystal semiconductor substrate 500, which is preferable. The single-crystal semiconductor substrate 500 can be divided with a cutting apparatus such as a dicer or a wire saw; or laser cutting, plasma cutting, electron beam cutting, or other arbitrary cutting means.

Note that the order of the steps up to forming the bonding layer on the surface of the single-crystal semiconductor substrate can be changed, as appropriate. FIGS. 5A to 5C and FIGS. 6A to 6C each illustrate an example in which, after the ion-doped layer is formed in the single-crystal semiconductor substrate and the insulating layer and the bonding layer are formed over the surface of the single-crystal semiconductor substrate, the single-crystal semiconductor substrate is processed into a desired size. On the other hand, for example, after the single-crystal semiconductor substrate is processed into a desired size, the ion-doped layer can be formed in the single-crystal semiconductor substrate having a desired size, and the insulating layer and the bonding layer can also be formed over the surface of the single-crystal semiconductor substrate having a desired size.

Next, the base substrate 400 and the single-crystal semiconductor substrate 510 are bonded to each other. FIG. 7A illustrates an example in which the base substrate 400 is disposed in close contact with the surface of the bonding layer 508 which is formed on the single-crystal semiconductor substrate 510, the base substrate 400 and the bonding layer 508 are bonded, and the base substrate 400 and the single-crystal semiconductor substrate 510 are bonded. Note that the surfaces which form the bond (the bonding surface) are preferably washed sufficiently. The base substrate 400 is disposed in close contact with the bonding layer 508, so that the bond is formed. Van der Waals forces act in this bond, and the base substrate 400 is disposed in close contact with the single-crystal semiconductor substrate 510 and pressure is applied thereto. Accordingly, a firm bond by hydrogen bonding can be formed.

Alternatively, the bonding surface may be activated in order to form a favorable bond between the base substrate 400 and the bonding layer 508. For example, either one or both of the surfaces which form the bond are irradiated with an atomic beam or an ion beam. In the case of using an atomic beam or an ion beam, a neutral atomic beam of an inert gas such as argon or an ion beam thereof can be used. Alternatively, the bonding surface can also be activated by plasma irradiation or radical irradiation. By such surface treatment, a bond between layers of different materials can be formed easily even at a temperature of less than or equal to 400° C.

In addition, after the base substrate 400 and the single-crystal semiconductor substrate 510 are bonded to each other with the bonding layer 508 interposed therebetween, it is preferable to perform heat treatment or pressure treatment. The bonding intensity can be improved by heat treatment of pressure treatment. Pressure treatment is preferably performed at a temperature of less than or equal to an allowable temperature limit of the base substrate 400. Pressure treatment is preformed so that pressure is applied in a direction vertical to the bonding surface in consideration of pressure resistance of the base substrate 400 and the single-crystal semiconductor substrate 510.

Next, heat treatment is performed, and part of the single-crystal semiconductor substrate 510 is separated with the ion-doped layer 504 as a separation surface (see FIG. 7B). The temperature of heat treatment is preferably greater than or equal to a film formation temperature of the bonding layer 508 and less than or equal to an allowable temperature limit of the base substrate 400. For example, heat treatment at a temperature of 400 to 600° C. is performed, so that minute voids which are formed in the ion-doped layer 504 vary in volume, and separation (which may also be referred to as cleavage) can be performed along the ion-doped layer 504. Since the bonding layer 508 is bonded to the base substrate 400, a single-crystal semiconductor layer 512 is left over the base substrate 400.

Through the above-described steps, a semiconductor substrate, in which the single-crystal semiconductor layer 512 is provided over the base substrate 400, with the bonding layer 508 interposed therebetween, and the crystalline semiconductor layer 410 (or a non-single-crystal semiconductor layer) is provided over the base substrate 400 is formed. Note that the semiconductor substrate which is described in this embodiment mode has a structure in which a plurality of single-crystal semiconductor layers are provided over one base substrate with a bonding layer interposed therebetween; however, the structure of the semiconductor substrate should not be interpreted as being limited thereto.

Note that a single-crystal semiconductor layer and a crystalline semiconductor layer (a non-single-crystal semiconductor layer) are formed on one surface of an insulating substrate in this embodiment mode; however, the present invention is not limited thereto. For example, a non-single-crystal semiconductor layer may be formed on one surface (a front surface) of an insulating substrate to form a display portion, and a single-crystal semiconductor layer may be formed on another surface (a back surface) of the insulating substrate to form a driver circuit portion. Since one surface of the insulating substrate can be entirely used as a display portion by having such a structure, a frame portion of a display device can be extremely small, and thus a display surface can be used effectively. In addition, the driver circuit is formed of a single-crystal semiconductor layer, so that operation speed which is necessary and sufficient for the driver circuit can be secured. Here, the display portion on the front surface and the driver circuit portion on the back surface can be electrically connected by, for example, a buried wiring which penetrates the insulating substrate such as a glass substrate. Alternatively, they are connected with the use of an FPC.

Note that a single-crystal semiconductor layer provided by separation is preferably subjected to chemical mechanical polishing (CMP) in order to planarize the surface thereof. Alternatively, the surface of the single-crystal semiconductor layer may be irradiated with laser light to be planarized without the use of physical polishing means. In the case of planarizing the single-crystal semiconductor layer by irradiation with laser light, laser light irradiation may also be performed on the non-single-crystal semiconductor layer at the same time to improve crystallinity thereof. Accordingly, planarization of the single-crystal semiconductor layer and characteristic improvement of the non-single-crystal semiconductor layer can be realized by a single step. That is, a step of crystallizing only the non-single-crystal semiconductor layer becomes unnecessary; therefore, the number of steps can be reduced, which results in reduction of manufacturing cost. As a laser, a laser such as one used for crystallization shown in this embodiment mode can be used. Note that laser light irradiation is preferably performed under a nitrogen atmosphere where an oxygen concentration is less than or equal to 10 ppm. This is because there is a concern that the surface of the single-crystal semiconductor layer may be roughed when laser light irradiation is performed under an oxygen atmosphere. Alternatively, CMP or the like may be performed in order to thin the obtained single-crystal semiconductor layer.

Note that this embodiment mode describes the case where the insulating layer 506 is formed after the ion-doped layer 504 is formed; however, the present invention should not be interpreted as being limited thereto. A structure in which the ion-doped layer 504 is formed after the insulating layer 506 is formed may also be employed.

With the use of the method shown in this embodiment mode, a substrate provided with both a single-crystal semiconductor layer and a non-single-crystal semiconductor layer can be provided. Accordingly, a circuit where high speed operation is required can be formed using a single-crystal semiconductor layer. Here, a circuit where high speed operation is required refers to a circuit where driving at a certain frequency or more is required. As an example, the circuit refers to a circuit where an operation at a frequency of greater than or equal to 1 MHz is required. A semiconductor layer which is used is defined by a required frequency because a frequency, at which a switching element used for a circuit can operate, largely depends on a semiconductor material. A switching element which uses a single-crystal semiconductor material having high carrier mobility (about 500 $cm^2/V \cdot s$ in a case of electrons in single-crystal silicon) has high transmittance speed of a signal and is suitable for high frequency operation. On the other hand, a switching element which uses a non-single-crystal semiconductor material having low carrier mobility (about 0.6 $cm^2/V \cdot s$ in a case of electrons in amorphous silicon) has low transmittance speed of a signal and is not suitable for high frequency operation. Note that an upper limit of a frequency at which a switching element can operate also depends on a parameter other than the material (for example, a channel length or the like); therefore, it is difficult to uniformly define high speed operation by a certain frequency or more. A frequency is shown here in accordance with performance as a tentative standard, which is required for a driver circuit of a display device.

Embodiment Mode 2

This embodiment mode will describe below a method for manufacturing a liquid crystal display device using a semiconductor substrate which is manufactured in Embodiment Mode 1 with reference to FIGS. 8A to 8C, FIGS. 9A to 9D, FIGS. 10A to 10C, and FIGS. 11A to 11C.

Figure 8A:
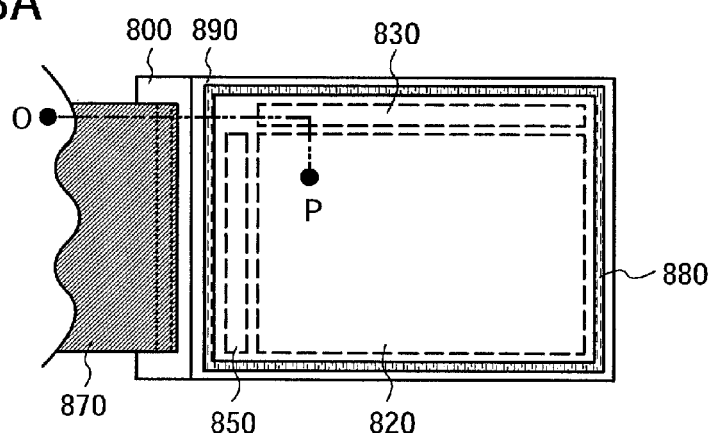
FIGS. 8A to 8C are a top view, a cross-sectional view, and a perspective view illustrating a liquid crystal display device of the present invention, respectively.
Figure 8B:
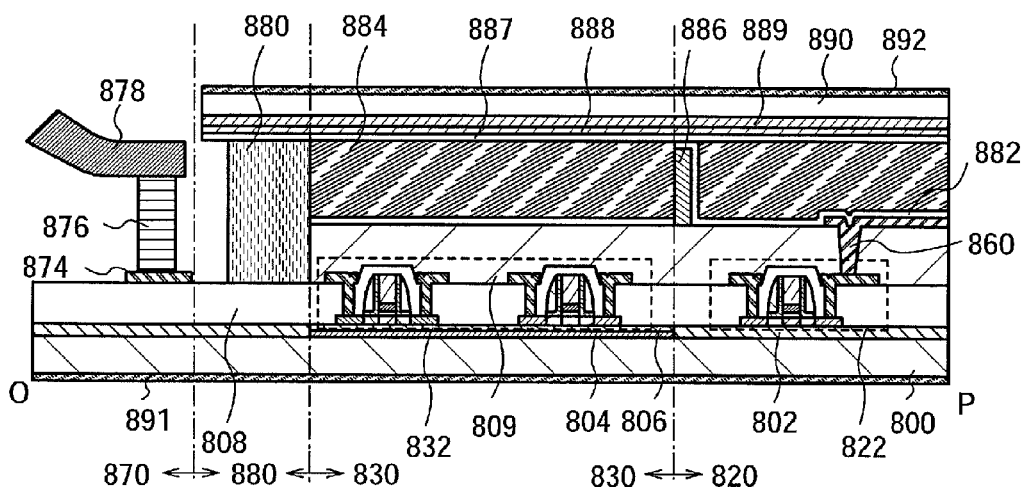
Figure 8C:
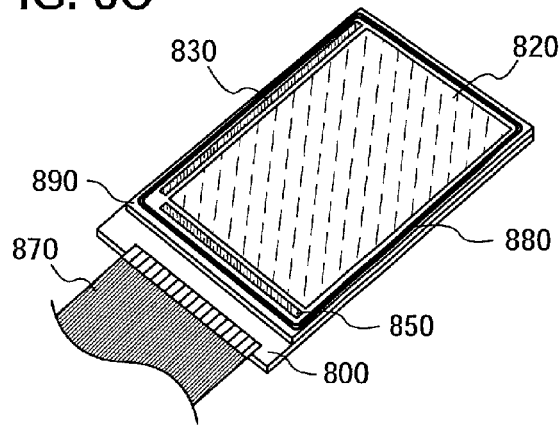

FIG. 8A is a top view of a liquid crystal display device. FIG. 8B is a cross-sectional view taken along line OP of FIG. 8A. FIG. 8C is a perspective view of a liquid crystal display device.

A liquid crystal display device according to this embodiment mode includes a display portion 820, a first driver circuit portion 830, and a second driver circuit portion 850 over a first substrate 800. The display portion 820, the first driver circuit portion 830, and the second driver circuit portion 850 are sealed with a sealant 880 between the first substrate 800 and a second substrate 890. Further, a terminal region 870 where an external input terminal which transmits signals from the outside to the first driver circuit portion 830 and the second driver circuit portion 850 is connected is provided over the first substrate 800.

As illustrated in FIG. 8B, a pixel circuit portion 822 including a transistor is provided in the display portion 820. A peripheral circuit portion 832 including a transistor is provided in the first driver circuit portion 830. An insulating layer 802 is provided between the first substrate 800 and the pixel circuit portion 822. A bonding layer 804 and an insulating layer 806 are stacked between the first substrate 800 and the peripheral circuit portion 832. Note that a structure in which an insulating layer that functions as a base insulating layer is provided over the substrate 800 may also be employed. An insulating layer 808 and an insulating layer 809 that function as interlayer insulating layers are provided in or over the pixel circuit portion 822 and the peripheral circuit portion 832. A source electrode or a drain electrode of the transistor formed in the pixel circuit portion 822 is electrically connected to a pixel electrode 860 through an opening formed in the insulating layer 809. Although circuits including transistors are integrated in the pixel circuit portion 822, only a cross section of one transistor is illustrated for the convenience. Although circuits including transistors are integrated also in the peripheral circuit portion 832, only a cross section of two transistors is illustrated for the convenience.

A liquid crystal layer 884 sandwiched between an orientation film 882 covering the pixel electrode 860, and an orientation film 887 is provided over the pixel circuit portion 822 and the peripheral circuit portion 832. In the liquid crystal layer 884, a distance (cell gap) is controlled with a spacer 886. A second substrate 890 is provided over the orientation film 887 with a counter electrode 888 and a color filter 889 interposed therebetween. The first substrate 800 and the second substrate 890 are bonded firmly with the sealant 880.

A polarizing plate 891 is provided outside the first substrate 800, and a polarizing plate 892 is provided outside the second substrate 890. Note that the polarizing plates are provided for the first substrate 800 and the second substrate 890 because a liquid crystal display device shown in this embodiment mode is a transmissive type. In the case of a reflective liquid crystal display device, for example, a polarizing plate may be provided only for the second substrate 890. The present invention can be applied to any of a transmissive type, a reflective type, or a semi-transmissive type with a combination thereof.

A terminal electrode 874 is provided in the terminal region 870. The terminal electrode 874 is electrically connected to an external input terminal 878 through an anisotropic conductive layer 876.

Next, an example of a method for manufacturing the liquid crystal display device illustrated in FIGS. 8A to 8C is described.

Figure 9A:
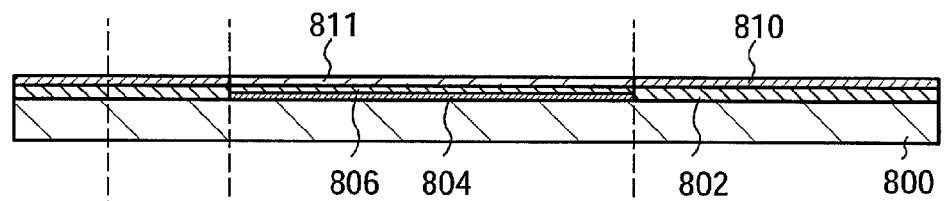
FIGS. 9A to 9D are cross-sectional views illustrating a manufacturing process of a liquid crystal display device of the present invention.

First, a semiconductor substrate is prepared (see FIG. 9A). An example in which a semiconductor substrate similar to that illustrated in FIG. 2B is used is shown here; however, the present invention should not be interpreted as being limited thereto.

A non-single-crystal semiconductor layer 810 is provided over the substrate 800, which is a base substrate, with the insulating layer 802 interposed therebetween, and a single-crystal semiconductor layer 811 is provided over the substrate 800 with the bonding layer 804 and the insulating layer 806 interposed therebetween. As the substrate 800, a substrate having an insulating surface or an insulating substrate is used. For example, a variety of glass substrates for electronic industry such as aluminosilicate glass, aluminoborosilicate glass, or barium borosilicate glass; a quartz substrate; a ceramic substrate; a sapphire substrate; or the like is used. Here, a glass substrate is used.

Note that another insulating layer that functions as a base insulating layer may be provided in order to prevent diffusion of movable ions of an alkali metal, an alkaline earth metal, or the like from the glass substrate. Specifically, it is preferable to form a nitrogen-containing insulating layer such as a silicon nitride layer or a silicon nitride oxide layer.

Next, the non-single-crystal semiconductor layer 810 is selectively etched to form a non-single-crystal semiconductor layer 821 in the display portion 820, and the single-crystal semiconductor layer 811 is selectively etched to form a first single-crystal semiconductor layer 831 and a second single-crystal semiconductor layer 841 in the first driver circuit portion 830. After that, gate electrodes 814 are formed over the non-single-crystal semiconductor layer 821, the first single-crystal semiconductor layer 831, and the second single-crystal semiconductor layer 841 with a gate insulating layer 812 interposed therebetween (see FIG. 9B).

In order to control a threshold voltage of transistors to be completed, an impurity element imparting one conductivity type may be added to the non-single semiconductor layer 821, the first single-crystal semiconductor layer 831, and the second single-crystal semiconductor layer 841 at a low concentration. In this case, the impurity element is also added to a channel formation region of the transistors. The impurity element added at this time is added at a concentration lower than a concentration at which an impurity element is added to a high concentration impurity region serving as a source region or a drain region and to a low concentration impurity region serving as a lightly-doped drain (LDD) region.

The gate electrodes 814 are formed by forming a conductive layer entirely over the substrate and then etching the conductive layer selectively to form a desired shape. Here, as the gate electrodes 814, after stacked-layer structures of conductive layers are formed, the conductive layers are selectively etched, so that the separated conductive layers are processed to cross the non-single-crystal semiconductor layer 821, the first single-crystal semiconductor layer 831, and the second single-crystal semiconductor layer 841, respectively.

The conductive layers forming the gate electrodes 814 can each be formed as follows: a conductive layer is formed entirely over the substrate by a CVD method or a sputtering method with the use of a metal element such as tantalum (Ta), tungsten (W), titanium (Ti), molybdenum (Mo), chromium (Cr), aluminum (Al), copper (Cu), or niobium (Nb), or an alloy or a compound material containing any of the above metal elements, and then the conductive layer is selectively etched. Further, a semiconductor material typified by polycrystalline silicon to which an impurity element imparting one conductivity type such as phosphorus is added can also be used.

Although this embodiment mode shows the example in which the gate electrodes 814 each have a stacked-layer structure of the two conductive layers, the gate electrodes may each have a single-layer structure or a stacked-layer structure of three or more layers. In addition, the side faces of the conductive layers may be tapered. In the case where the gate electrodes each have a stacked-layer structure of conductive layers, the conductive layer in a lower portion may be wider than the conductive layer in an upper portion, or the side faces of the conductive layers may have different taper angles from each other.

The gate insulating layers 812 can be formed by a CVD method, a sputtering method, an ALD method, or the like with the use of a material such as silicon oxide, silicon oxynitride, hafnium oxide, aluminum oxide, or tantalum oxide. Further, the gate insulating layers 812 can also be formed by solid-phase oxidizing or solid-phase nitriding the non-single-crystal semiconductor layer 821, the first single-crystal semiconductor layer 831, and the second single-crystal semiconductor layer 841 by plasma treatment. Alternatively, insulating layers may be formed by a CVD method or the like and the insulating layers may be solid-phase oxidized or solid-phase nitrided by plasma treatment.

Figure 9B:
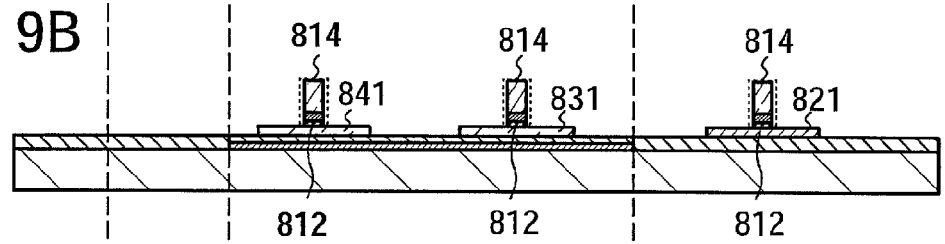
Figure 9C:
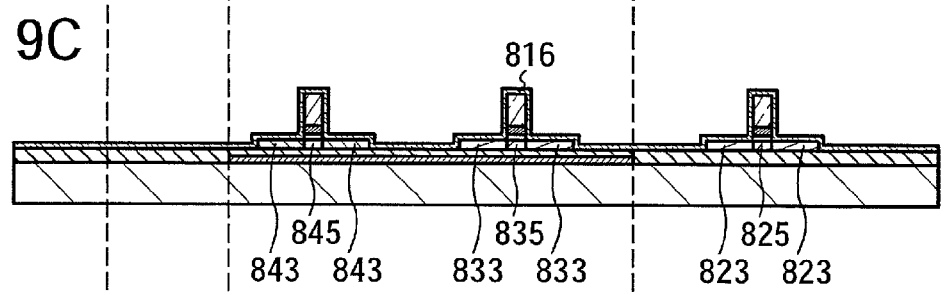
Figure 9D:
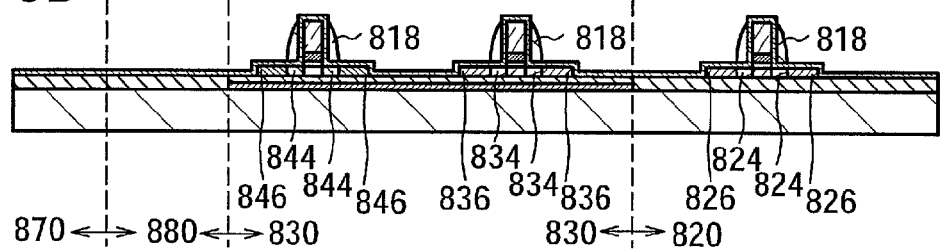

FIG. 9B illustrates an example in which the gate insulating layers 812 and the gate electrodes 814 are processed so that the end portions thereof are aligned; however, there is no particular limit, and the gate insulating layers 812 may be left in etching the gate electrodes 814.

In a case of using a material with a high dielectric constant (also referred to as a high-k material) is used for the gate insulating layers 812, the gate electrodes 814 are formed using polycrystalline silicon, silicide, metal, or metal nitride. Preferably, the gate electrodes 814 are formed using metal or metal nitride. For example, in the gate electrodes 814, the conductive layers in contact with the gate insulating layers 812 are formed using a metal nitride material, and the conductive layers thereover are formed using a metal material. The combination like this can prevent a depletion layer from spreading in the gate electrodes even in a case where the gate insulating layers are thinned, and further can prevent driving performance of transistors from being damaged even in a case where miniaturization is done.

Next, an insulating layer 816 is formed over the gate electrodes 814. Then, an impurity element imparting one conductivity type is added using the gate electrodes 814 as masks (see FIG. 9C). Here, an example is shown in which impurity elements imparting different types of conductivity are added to the first single-crystal semiconductor layer 831 and the second single-crystal semiconductor layer 841 which are formed in the first driver circuit portion 830. Further, an example is shown in which an impurity element imparting the same type of conductivity as that of the first single-crystal semiconductor layer 831 is added to the non-single-crystal semiconductor layer 821 which is formed in a display portion 820.

In the non-single-crystal semiconductor layer 821 which is formed in the display portion 820, a pair of impurity regions 823 and a channel formation region 825 located between the pair of impurity regions 823 are formed in a self-aligned manner using the gate electrode 814 as a mask.

In the first single-crystal semiconductor layer 831 which is formed in the first driver circuit portion 830, a pair of impurity regions 833 and a channel formation region 835 located between the pair of impurity regions 833 are formed in a self-aligned manner using the gate electrode 814 as a mask. In the second single-crystal semiconductor layer 841, a pair of impurity regions 843 and a channel formation region 845 located between the pair of impurity regions 843 are formed in a self-aligned manner using the gate electrode 814 as a mask. Impurity elements imparting different types of conductivity are added to the impurity regions 833 and 843.

As the impurity element imparting one conductivity type, an element imparting p-type conductivity such as boron (B), aluminum (Al), or gallium (Ga), or an element imparting n-type conductivity such as phosphorus (P) or arsenic (As) can be used. In this embodiment mode, an element imparting n-type conductivity, for example, phosphorus, is added to the non-single-crystal semiconductor layer 821 which is formed in the display portion 820 and the first single-crystal semiconductor layer 831 which is formed in the first driver circuit portion 830. In addition, an element imparting p-type conductivity, for example, boron, is added to the second single-crystal semiconductor layer 841. When the impurity element is added to the non-single-crystal semiconductor layer 821 and the first single-crystal semiconductor layer 831, the second single-crystal semiconductor layer 841 may be selectively covered with a resist mask or the like. Similarly, when the impurity element is added to the second single-crystal semiconductor layer 841, the non-single-crystal semiconductor layer 821 and the first single-crystal semiconductor layer 831 may be selectively covered with a resist mask or the like.

The insulating layer 816 can be formed by a CVD method, a sputtering method, an ALD method, or the like with the use of a material such as silicon oxide, silicon oxynitride, silicon nitride, or silicon nitride oxide. With a structure in which the impurity element is added by passing through the insulating layer 816 in adding the impurity element imparting one conductivity type, damage to the non-single-crystal semiconductor layer and the single-crystal semiconductor layers can be reduced.

Next, sidewall insulating layers 818 are formed on the side surfaces of the gate electrodes 814. Then, the impurity element imparting one conductivity type is added using the gate electrodes 814 and the sidewall insulating layers 818 as masks (see FIG. 9D). Note that the impurity elements having the same conductivity types as those used in the previous step (the steps of forming the impurity regions 823, 833, and 843) are added to the non-single-crystal semiconductor layer 821, the first single-crystal semiconductor layer 831, and the second single-crystal semiconductor layer 841. The impurity elements are added at higher concentrations than those of the impurity elements used in the previous step.

In the non-single-crystal semiconductor layer 821, a pair of high concentration impurity regions 826 and a pair of low concentration impurity regions 824 are formed in a self-aligned manner using the gate electrode 814 and the sidewall insulating layers 818 as a mask. The high concentration impurity regions 826 formed here each serve as a source region or a drain region, and the low concentration impurity regions 824 each serve as a lightly doped drain (LDD) region.

In the first single-crystal semiconductor layer 831, a pair of high concentration impurity regions 836 and a pair of low concentration impurity regions 834 are formed in a self-aligned manner using the gate electrode 814 and the sidewall insulating layers 818 as a mask. The high concentration impurity regions 836 formed here each serve as a source region or a drain region, and the low concentration impurity regions 834 each serve as an LDD region. In the second single-crystal semiconductor layer 841, a pair of high concentration impurity regions 846 and a pair of low concentration impurity regions 844 are formed in a self-aligned manner using the gate electrode 814 and the sidewall insulating layers 818 as a mask.

When the impurity element is added to the non-single-crystal semiconductor layer 821 and the first single-crystal semiconductor layer 831, the second single-crystal semiconductor layer 841 may be selectively covered with a resist mask or the like. Similarly, when the impurity element is added to the second single-crystal semiconductor layer 841, the non-single-crystal semiconductor layer 821 and the first single-crystal semiconductor layer 831 may be selectively covered with a resist mask or the like.

The sidewall insulating layers 818 is provided on the side surfaces of the gate electrodes 814 with the insulating layer 816 interposed therebetween. For example, the sidewall insulating layers 818 can be provided for the side surfaces of the gate electrodes 814 in a self-aligned manner by anisotropic etching, which proceeds mainly in the perpendicular direction, of an insulating layer formed to embed the gate electrodes 814. The sidewall insulating layers 818 can be formed using a material such as silicon nitride, silicon nitride oxide, silicon oxide, or silicon oxynitride. In the case where the insulating layer 816 is formed using silicon oxide or silicon oxynitride, the insulating layer 816 can function as an etching stopper when the sidewall insulating layers 818 is formed using silicon nitride or silicon nitride oxide. In the case where the insulating layer 816 is formed using silicon nitride or silicon nitride oxide, the sidewall insulating layers 818 may be formed using silicon oxide or silicon oxynitride. When the insulating layer that functions as an etching stopper is provided in this manner, the non-single-crystal semiconductor layer and the single-crystal semiconductor layers can be prevented from being etched because of over-etching in forming the sidewall insulating layers.

Figure 10A:
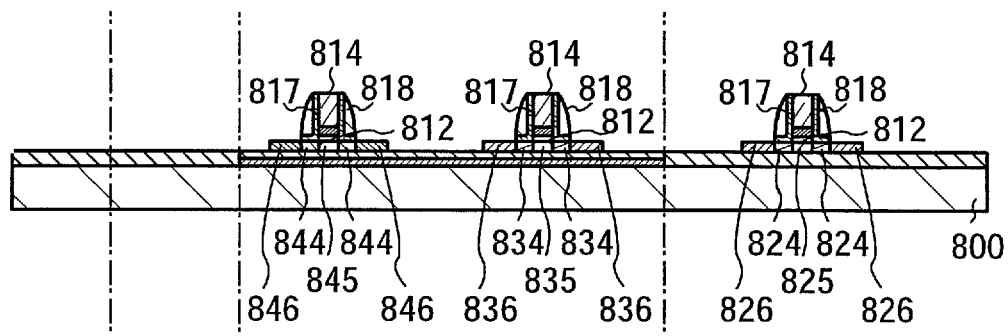
FIGS. 10A to 10C are cross-sectional views illustrating a manufacturing process of a liquid crystal display device of the present invention.
Figure 10B:
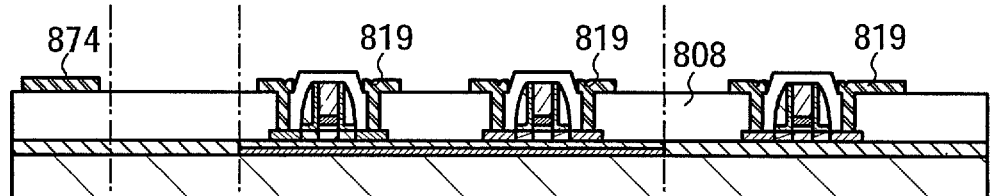
Figure 10C:
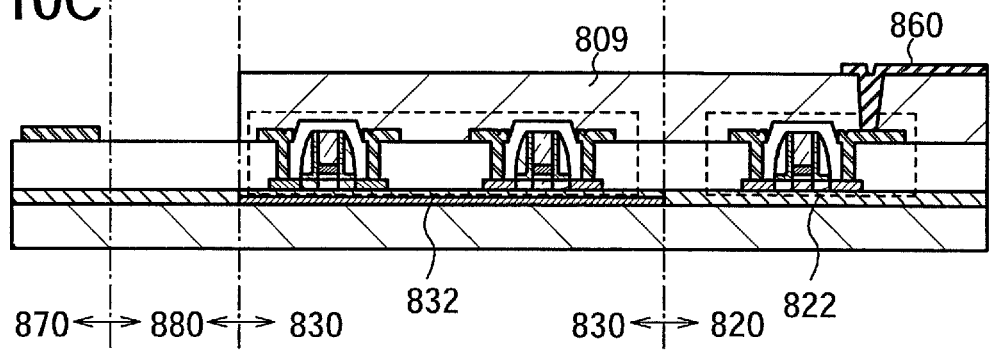
Figure 11A:
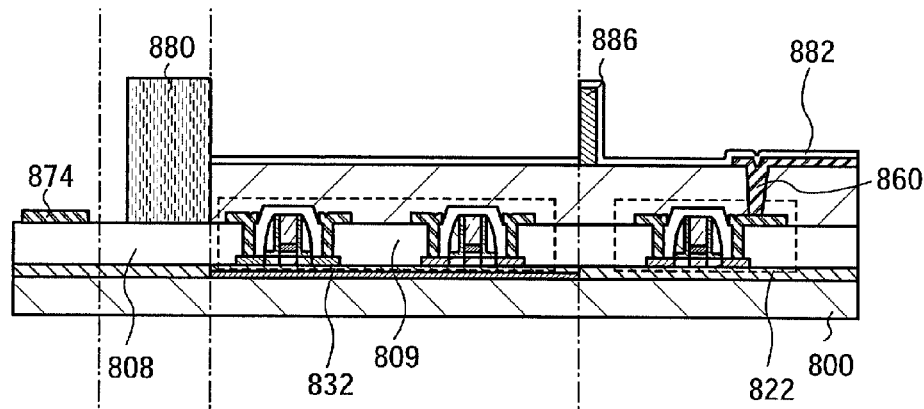
FIGS. 11A to 11C are cross-sectional views illustrating a manufacturing process of a liquid crystal display device of the present invention.
Figure 11B:
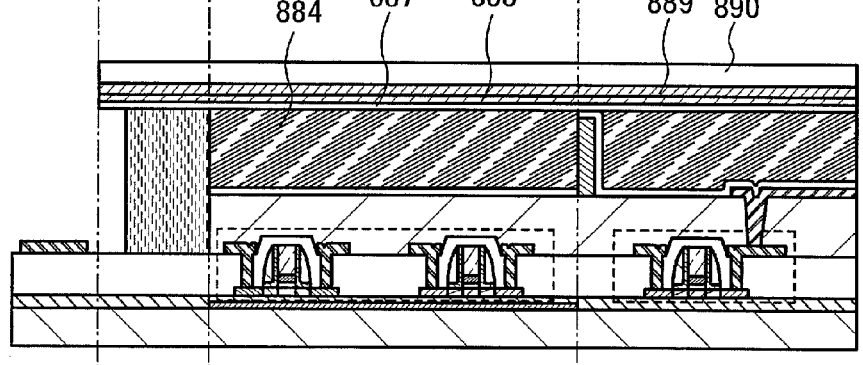
Figure 11C:
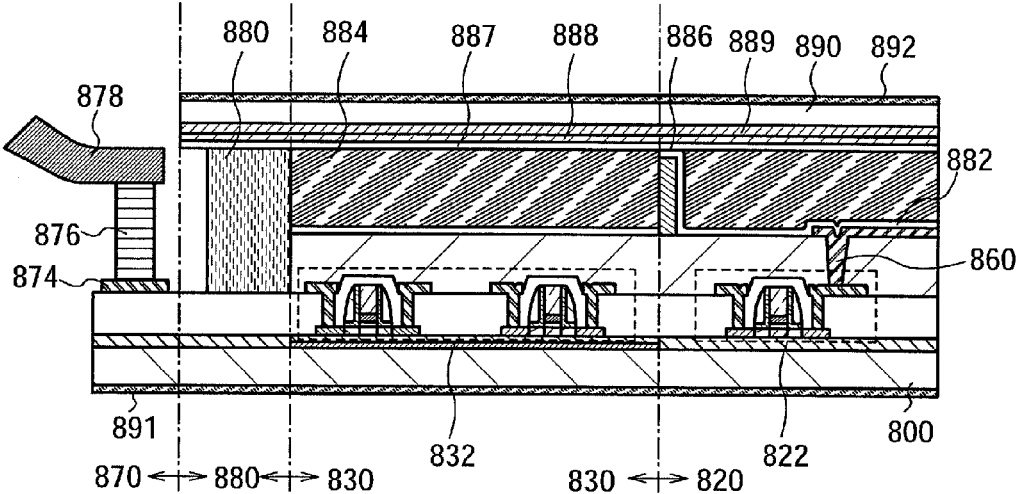

Next, exposed portions of the insulating layer 816 are etched (see FIG. 10A). The insulating layer 816 is left between the sidewall insulating layers 818 and the gate electrode 814, between the sidewall insulating layers 818 and the non-single-crystal semiconductor layer 821, between the sidewall insulating layers 818 and the first single-crystal semiconductor layer 831, and between the sidewall insulating layers 818 and the second single-crystal semiconductor layer 841.

A silicide layer may be formed in order to lower the resistance of the high concentration impurity regions that each function as a source region or a drain region. For the silicide layer, cobalt silicide or nickel silicide may be applied. In the case where the non-single-crystal semiconductor layer and the single-crystal semiconductor layers each have a small thickness, a silicide reaction may proceed to the bottom portion of the non-single-crystal semiconductor layer and the single-crystal semiconductor layers where the high concentration impurity region is formed, so that the non-single-crystal semiconductor layer and the single-crystal semiconductor layers may be fully silicided.

Next, an insulating layer 808 is formed entirely over the substrate 800 and then is selectively etched, so that openings are formed to reach the high concentration impurity regions 826 which are formed in the non-single-crystal semiconductor layer 821 in the display portion 820. Further, openings are formed to reach the high concentration impurity regions 836 and 846 which are formed in the first single-crystal semiconductor layer 831 and the second single-crystal semiconductor layer 841 in the first driver circuit portion 830. Then, conductive layers 819 are formed so as to fill the openings. Further, the terminal electrode 874 is formed in the terminal region 870 (see FIG. 10B).

The insulating layer 808 is formed by a CVD method, a sputtering method, an atomic layer deposition (ALD) method, a coating method, or the like with the use of an inorganic insulating material containing oxygen and/or nitrogen such as silicon oxide, silicon nitride, silicon oxynitride, or silicon nitride oxide; an insulating material containing carbon such as diamond like carbon (DLC); an organic insulating material such as epoxy, polyimide, polyamide, polyvinylphenol, benzocyclobutene, or acrylic; or a siloxane material such as a siloxane resin. Note that the siloxane material corresponds to a material having a Si—O—Si bond. Siloxane includes a skeleton structure of a bond of silicon (Si) and oxygen (O). As a substituent, an organic group containing at least hydrogen (e.g., an alkyl group or aromatic hydrocarbon) is used. Alternatively, a fluoro group, or a fluoro group and an organic group containing at least hydrogen can be used as a substituent. Further, as the insulating layer 808, an insulating layer may be formed by a CVD method, a sputtering method, or an ALD method, and then be subjected to plasma treatment under an oxygen atmosphere or a nitrogen atmosphere. An example in which the insulating layer 808 has a single-layer structure is shown here; however, the insulating layer 808 may have a stacked-layer structure of two or more layers. Furthermore, an inorganic insulating layer or an organic insulating layer may be combined to form the insulating layer 808. For example, a silicon nitride film or a silicon nitride oxide film that functions as a passivation layer, can be formed over the entire surface of the substrate 800, and an insulating layer formed using phosphosilicate glass (PSG) or borophosphosilicate glass (BPSG), which can serve as a planarization layer, can be formed thereover.

The conductive layers 819 each function as a source electrode or a drain electrode. The conductive layers 819 that each function as a source electrode or a drain electrode are electrically connected to the non-single-crystal semiconductor layer 821, the first single-crystal semiconductor layer 831, and the second single-crystal semiconductor layer 841 through the openings formed in the insulating layer 808.

The conductive layers 819 can be formed in the following manner: a conductive layer is formed over the entire surface of the substrate, to have a single-layer structure or a stacked-layer structure, by a CVD method or a sputtering method, with the use of a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing any of the above metal element; and then the conductive layer is selectively etched. As examples of an alloy material containing aluminum, an alloy material containing aluminum as its main component and further containing nickel, and an alloy material containing aluminum as its main component and further containing nickel and either one or both of carbon and silicon can be given. Further, as an example of a compound material containing tungsten, tungsten silicide can be given. The conductive layers 819 can employ a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer, for example. A barrier layer corresponds to a thin film formed of titanium, nitride of titanium, molybdenum, or nitride of molybdenum. Aluminum or aluminum silicon, which has low resistance and is inexpensive, is the most suitable for forming the conductive layers that each function as a source electrode or a drain electrode. Further, generation of a hillock of aluminum or aluminum silicon can be prevented when barrier layers are provide as upper and lower barrier layers of the conductive layers that each function as a source electrode or a drain electrode.

The terminal electrode 874 in the terminal region 870 functions as an electrode for connecting the first driver circuit portion 830 and the second driver circuit portion 850 to the external input terminal that is formed later, such as an FPC. An example is shown here in which the terminal electrode 874 is formed using the same material and with the same layer as that of the conductive layers 819.

In the above manner, the pixel circuit portion 822 including the transistor having the non-single-crystal semiconductor layer 821 is formed in the display portion 820. Further, the peripheral circuit portion 832 including the transistor having the first single-crystal semiconductor layer 831 and the transistor having the second single-crystal semiconductor layer 841 is formed in the first driver circuit portion 830.

Note that a step of applying doping or the like to the non-single-crystal semiconductor layer and the single-crystal semiconductor layer at the same time are described in this embodiment mode; however, the present invention is not limited thereto. A liquid crystal display device may be manufactured using steps most suitable for the non-single-crystal semiconductor layer and steps most suitable for the single-crystal semiconductor layer. Note that a manufacturing process can be extremely simplified in the case where etching, doping, or the like is applied to the non-single-crystal semiconductor layer and the single-crystal semiconductor layer at the same time; therefore, an advantageous effect such as low cost, improvement of yield, or the like can be obtained.

Next, the insulating layer 809 is formed over the display portion 820 and the first drive circuit portion 830. The insulating layer 809 over the display portion 820 is selectively etched to form an opening that reaches the conductive layer 819 of the transistor in the pixel circuit portion 822. After that, the pixel electrode 860 is formed so as to fill in the opening (see FIG. 10C).

As the insulating layer 809, it is preferable to form a planarizing layer which can form a planarized surface by smoothing unevenness of the display portion 820 and the first driver circuit portion 830. The insulating layer 809 can be formed using an organic insulating material such as epoxy, polyimide, polyamide, polyvinyl phenol, benzocyclobutene, or acrylic, or a siloxane material such as a siloxane resin, for example. Although an example in which the insulating layer 809 has a single-layer structure is shown here, the insulating layer 809 may have a stacked-layer structure of two or more layers. In the case of a stacked-layer structure, for example, the insulating layer 809 can have a stacked-layer structure including an organic resin layer or the like as an upper layer and an inorganic insulating layer of silicon oxide, silicon nitride, silicon oxynitride, or the like as a lower layer; or a structure in which an organic insulating layer is sandwiched between inorganic insulating layers. The insulating layer 809 can be formed selectively by a variety of printing methods (e.g., screen printing, planographic printing, relief printing, or gravure printing), a droplet discharge method, a dispenser method, or the like. Alternatively, after the insulating layer is formed over the entire surface by a spin coating method or the like, the insulating layer 809 can be selectively formed by etching in a region other than a desired region (here the display portion 820 and the first driver circuit portion 830).

The pixel electrode 860 is preferably formed using a material that transmits visible light in this embodiment mode. As a conductive material that transmits visible light, indium tin oxide (ITO), indium tin oxide containing silicon oxide (ITSO), zinc oxide (ZnO), indium zinc oxide (IZO), zinc oxide added with gallium (GZO), and the like can be given. On the other hand, in the case where the thickness of the pixel electrode 860 can be made small enough, the material thereof is not limited to the above. This is because, even in a case of a material that does not transmit light in the general thickness, light transmits the pixel electrode 860 when the thickness thereof is small enough. In such a case, a metal element such as tantalum (Ta), tungsten (W), titanium (Ti), molybdenum (Mo), aluminum (Al), chromium (Cr), or silver (Ag), or an alloy material or a compound material containing any of the metal elements can be used. Note that any of the above metal elements or the like may be used in the case of manufacturing a reflective or semi-transmissive liquid crystal display device.

Next, the spacer 886 is formed, and then the orientation film 882 is formed so as to cover the pixel electrode 860 and the spacer 886. Next, the sealant 880 is formed so as to surround the display portion 820, the first driver circuit portion 830, and the second driver circuit portion 850 (see FIG. 11A).

The spacer 886 can be formed using an organic insulating material such as epoxy, polyimide, polyamide, polyimide amide, or acrylic; or an inorganic insulating material such as silicon oxide, silicon nitride, silicon oxynitride, or silicon nitride oxide, to have a single-layer structure or a stacked-layer structure. In this embodiment mode, in order to form a columnar spacer as the spacer 886, an insulating layer is formed over the entire surface of the substrate and then is etched, so that the spacer with a desired shape is obtained. The shape of the spacer 886 is not particularly limited, and spherical spacers may be dispersed. The spacer 886 can retain the cell gap.

The orientation film 882 is a layer which can orient the liquid crystals in a uniform direction. A material of the orientation film 882 may be determined corresponding with an operation mode of liquid crystals, as appropriate. For example, the layer is formed using polyimide, polyamide, or the like and is subjected to orientation treatment, so that the orientation film 882 can be formed. As orientation treatment, rubbing, ultraviolet ray irradiation, or the like may be performed. Although a forming method of the orientation film 882 is not particularly limited, the orientation film 882 can be formed selectively over the insulating layer 809 when a variety of printing methods or a droplet discharging method is used.

The sealant 880 is formed so as to surround at least the display portion. In this embodiment mode, a seal pattern is formed so as to surround the periphery of the display portion 820, the first driver circuit portion 830, and the second driver circuit portion 850. As the sealant 880, a thermosetting resin or a photo-curing resin can be used. The cell gap can be retained also by making a filler included in the sealant. The sealant 880 is cured by being subjected to light irradiation, heat treatment, or the like in a later step of sealing the substrate and another substrate over which a counter electrode, a color filter, or the like is provided.

The liquid crystal layer 884 is formed in a region surrounded by the sealant 880. Further, the second substrate 890 over which the color filter 889, the counter electrode 888, and the orientation film 887 are sequentially stacked is bonded to the first substrate 800 (see FIG. 11B).

The liquid crystal layer 884 is formed using a desired liquid crystal material. For example, the liquid crystal layer 884 can be formed by dripping the liquid crystal material into the seal pattern formed with the sealant 880. The liquid crystal material may be dripped by a dispenser method or a droplet discharge method. It is preferable that the liquid crystal material be degassed under a reduced pressure in advance or after being dripped. Further, it is preferable that the liquid crystal material be dripped in an inert atmosphere so that impurities or the like are not mixed therein. Further, it is preferable that an atmosphere be set under a reduced pressure after forming the liquid crystal layer 884 by dripping the liquid crystal material until bonding the first substrate 800 and the second substrate 890 to each other so that a bubble or the like is not formed in the liquid crystal layer 884.

It is also possible to form the liquid crystal layer 884 by bonding the first substrate 800 and the second substrate 890 to each other and then injecting the liquid crystal material into the inside of the frame-shaped pattern of the sealant 880 using a capillary phenomenon. In this case, an opening for injecting the liquid crystal is formed in advance in the sealant or the like. It is preferable that the liquid crystal material be injected under a reduced pressure.

The first substrate 800 and the second substrate 890 are made to face to each other in close contact, and then the sealant 880 is cured to bond the first substrate 800 and the second substrate 890. At this time, the first substrate 800 and the second substrate 890 are bonded to each other so that the liquid crystal layer 884 is sandwiched between the orientation film 887 provided for the second substrate 890 and the orientation film 882 provided for the first substrate 800. It is also possible to correct orientation disorder of the liquid crystal layer 884 by heat treatment after bonding the first substrate 800 and the second substrate 890 to each other and forming the liquid crystal layer 884.

For the second substrate 890, a light-transmitting substrate is used. For example, a variety of glass substrates such as aluminosilicate glass, aluminoborosilicate glass, or barium borosilicate glass; a quartz substrate; a ceramic substrate; or a sapphire substrate can be used.

Before the bonding, the color filter 889, the counter electrode 888, and the orientation film 887 are sequentially formed over the second substrate 890. In addition to the color filter 889, a black matrix may be provided for the second substrate 890. The color filter 889 may be provided outside the second substrate 890. The color filter 889 may be omitted when the display device performs monochrome display. The sealant may be provided on the second substrate 890 side. In the case where the sealant is provided on the second substrate 890 side, the liquid crystal material is dripped inside the pattern of the sealant which is provided for the second substrate 890.

The counter electrode 888 can be formed using a conductive material which has a property to transmit visible light, such as indium tin oxide (ITO), indium tin oxide containing silicon oxide (ITSO), zinc oxide (ZnO), indium zinc oxide (IZO), or zinc oxide to which gallium is added (GZO). The orientation film 887 can be formed in a similar manner to the orientation film 882.

In the above manner, a structure is obtained in which the display portion 820, the first driver circuit portion 830, and the second driver circuit portion 850 that include the liquid crystal layer 884 are sealed between the first substrate 800 and the second substrate 890. In the circuit portion formed in the display portion 820, the first driver circuit portion 830, or the second circuit portion 850, a resistor, a capacitor, or the like may be formed at the same time in addition to the transistor. Further, the structure of the transistor is not particularly limited. For example, the transistor can have a multi-gate structure in which a plurality of gates are provided for one non-single-crystal semiconductor layer or single-crystal semiconductor layer.

Next, the polarizing plate 891 and the polarizing plate 892 are provided for the first substrate 800 and the second substrate 890, respectively. Further, the external input terminal 878 is connected to the terminal electrode 874 through the anisotropic conductive layer 876 (see FIG. 11C).

The external input terminal 878 has a function of transmitting a signal (e.g., a video signal, a clock signal, a start signal, or a reset signal) or potential from the outside. In this embodiment mode, an FPC is connected as the external input terminal 878. The terminal electrode 874 is electrically connected to the first driver circuit portion 830 and the second driver circuit portion 850.

In the above manner, a liquid crystal display device can be obtained. As shown in this embodiment mode, a driver circuit portion is formed using a single-crystal semiconductor layer and a display portion (a pixel portion) is formed using a non-single-crystal semiconductor layer, so that a driver circuit having characteristics which are necessary and sufficient can be manufactured while the manufacturing cost is reduced. Accordingly, a complete monolithic semiconductor device can be manufactured; therefore, the manufacturing cost can be reduced. In addition, the thickness which results from connecting an IC to outside can be reduced. Moreover, a semiconductor device in which an area of a frame portion is reduced can be manufactured. Further, a high-performance semiconductor device can be manufactured using a substrate having low heat resistance such as a glass substrate.

Note that this embodiment mode can be combined with Embodiment Mode 1, as appropriate.

Embodiment Mode 3

Figure 12A:
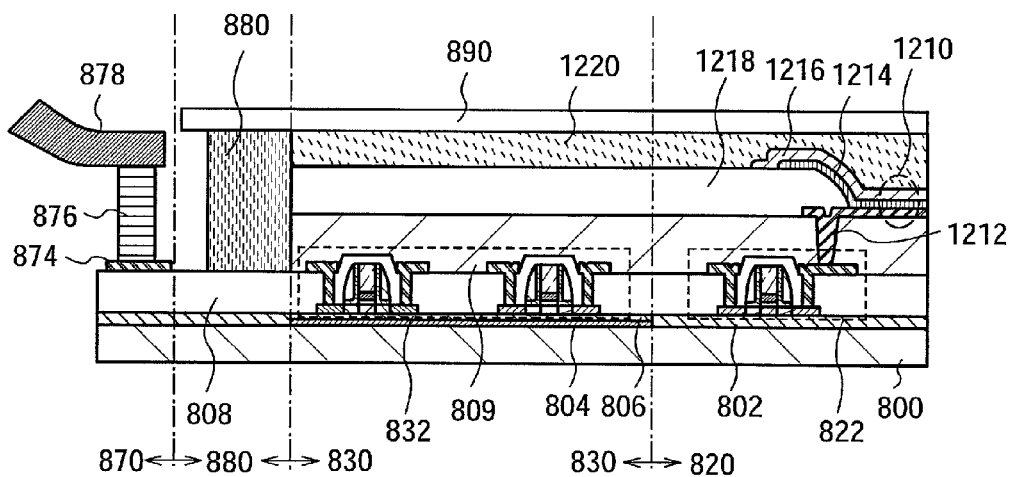
FIGS. 12A and 12B are cross-sectional views each illustrating a display device of the present invention.
Figure 12B:
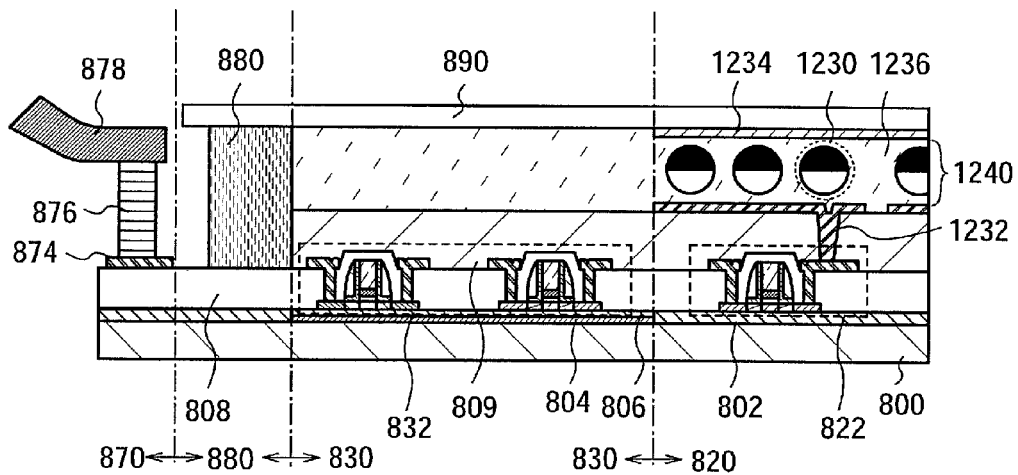

Embodiment Mode 2 shows an example in which a display device which uses a liquid crystal display device is manufactured; however, this embodiment mode will describe another display device with reference to FIGS. 12A and 12B.

FIG. 12A illustrates an example of a display device using a light-emitting element (also referred to as a light-emitting device or an EL display device). FIG. 12B illustrates an example of a display device using an electrophoretic element (also referred to as electronic paper or an electrophoretic display device). Note that detailed description thereof is omitted because structures other than those of display elements are similar to those shown in Embodiment Mode 2.

FIG. 12A illustrates a display device using a light-emitting element 1210 instead of a liquid crystal element. Here, an example is shown in which an organic compound layer 1214 is provided between a pixel electrode (cathode) 1212 and a counter electrode (anode) 1216. The organic compound layer 1214 includes at least a light-emitting layer, and may further include an electron-injecting layer, an electron-transporting layer, a hole-transporting layer, a hole-injecting layer, or the like. An end portion of the pixel electrode 1212 is covered with a partition layer 1218. The partition layer 1218 may be formed in the following manner: an insulating material is deposited over an entire substrate and processed so that part of the pixel electrode 1212 is exposed; or it is selectively formed by a droplet discharge method or the like. The organic compound layer 1214 and the counter electrode 1216 are sequentially stacked over the pixel electrode 1212 and the partition layer 1218. Space 1220 between the light-emitting element 1210 and the second substrate 890 may be filled with an inert gas or the like, or a resin or the like may be formed in the space 1220.

Note that a light-emitting element is formed using an organic material in this embodiment mode; however, the present invention should not be interpreted as being limited thereto. A light-emitting element may be formed using an inorganic material or with a combination of an organic material and an inorganic material.

FIG. 12B illustrates a display device using an electrophoretic element instead of a liquid crystal element. Here, an example is shown in which an electrophoretic layer 1240 is provided between a pixel electrode 1232 and a counter electrode (common electrode) 1234. The electrophoretic layer 1240 includes a plurality of microcapsules 1230 fixed with a binder 1236. Each of the microcapsules 1230 has a diameter of about 10 to 200 μm, and a transparent liquid, a positively charged white microparticle, and a negatively charged black microparticle are encapsulated therein. When an electric field is applied by the pixel electrode 1232 and the counter electrode 1234, the white microparticle and the black microparticle move to opposite sides in the microcapsule 1230, so that white or black can be displayed. An electrophoretic element is a display element to which this principle is applied. With the use of an electrophoretic element, which has higher reflectance than a liquid crystal element, a display portion can be recognized even in a dim place without an auxiliary light (e.g., a front light). Further, power consumption is small. Furthermore, an image which is displayed once can be retained even when power is not supplied to the display portion.

Note that this embodiment mode can be combined with any of Embodiment Modes 1 and 2, as appropriate.

Embodiment Mode 4

An electronic device using a display device of the present invention will be described with reference to FIGS. 13A to 13H.

Examples of electronic devices using a display device of the present invention include cameras such as a video camera and a digital camera, a goggle-type display (a head-mounted display), a navigation system, an audio reproducing device (such as car audio components), a computer, a game machine, a portable information terminal (such as a mobile computer, a cellular phone, a portable game machine, and an electronic book), an image reproducing device provided with a recording medium (specifically, a device for reproducing a recording medium such as a digital versatile disc (DVD) and having a display for displaying the reproduced image), and the like.

Figure 13A:
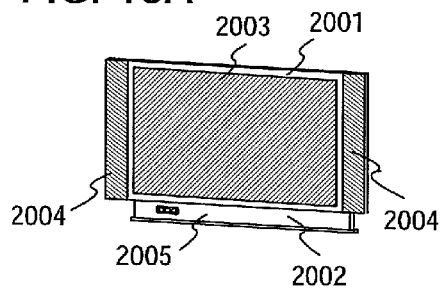
FIGS. 13A to 13H are views each illustrating an electronic device of the present invention.

FIG. 13A illustrates a monitor of a television receiving device or a personal computer, which includes a housing 2001, a support base 2002, a display portion 2003, speaker portions 2004, a video input terminal 2005, and the like. A display device of the present invention is used for the display portion 2003. According the present invention, a low-cost and high-performance television receiving device or personal computer can be provided.

Figure 13B:
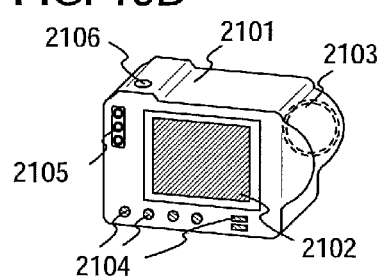

FIG. 13B illustrates a digital camera. An image receiving portion 2103 is provided in the front side of a main body 2101. A shutter button 2106 is provided at the upper portion of the main body 2101. A display portion 2102, operation keys 2104, and an external connection port 2105 are provided at the backside of the main body 2101. A display device of the present invention is used for the display portion 2102. According the present invention, a low-cost and high-performance digital camera can be provided.

Figure 13C:
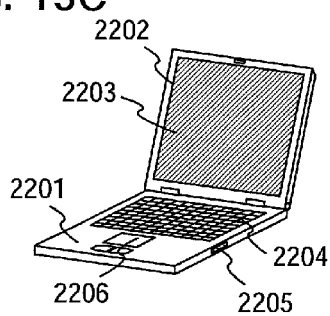

FIG. 13C illustrates a laptop personal computer. A main body 2201 is provided with a keyboard 2204, an external connection port 2205, and a pointing device 2206. A housing 2202 including a display portion 2203 is attached to the main body 2201. A display device of the present invention is used for the display portion 2203. According the present invention, a low-cost and high-performance laptop personal computer can be provided.

Figure 13D:
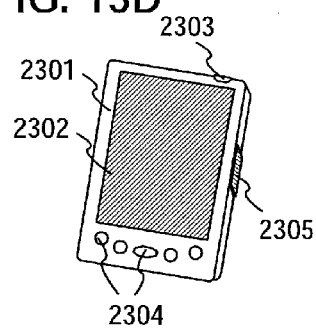

FIG. 13D illustrates a mobile computer, which includes a main body 2301, a display portion 2302, a switch 2303, operation keys 2304, an infrared port 2305, and the like. A display device of the present invention is used for the display portion 2302. According the present invention, a low-cost and high-performance mobile computer can be provided.

Figure 13E:
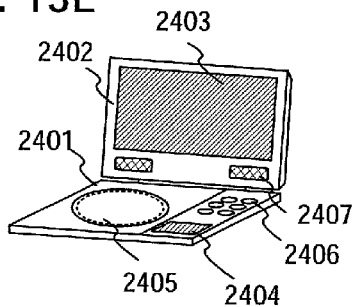

FIG. 13E illustrates an image reproducing device. A main body 2401 is provided with a display portion B 2404, a recording medium reading portion 2405, and operation keys 2406. A housing 2402 including a speaker portion 2407 and a display portion A 2403 is attached to the main body 2401. A display device of the present invention is used for each of the display portion A 2403 and the display portion B 2404. According the present invention, a low-cost and high-performance image reproducing device can be provided.

Figure 13F:
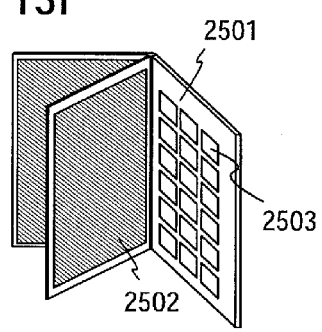

FIG. 13F illustrates an electronic book. A main body 2501 is provided with operation keys 2503. A plurality of display portions 2502 are attached to the main body 2501. A display device of the present invention is used for the display portions 2502. According the present invention, a low-cost and high-performance electronic book can be provided.

Figure 13G:
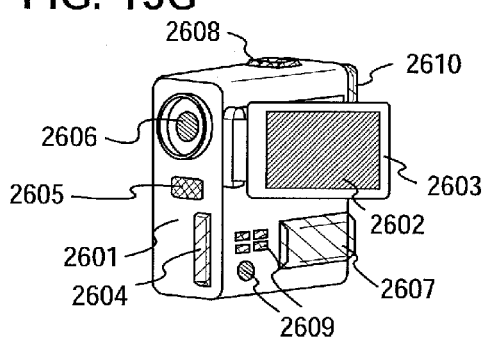

FIG. 13G illustrates a video camera. A main body 2601 is provided with an external connection port 2604, a remote control receiving portion 2605, an image receiving portion 2606, a battery 2607, an audio input portion 2608, operation keys 2609, and an eyepiece portion 2610. A housing 2603 including a display portion 2602 is attached to the main body 2601. A display device of the present invention is used for the display portion 2602. According the present invention, a low-cost and high-performance video camera can be provided.

Figure 13H:
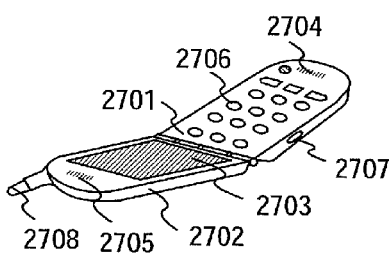
Figure 14A:
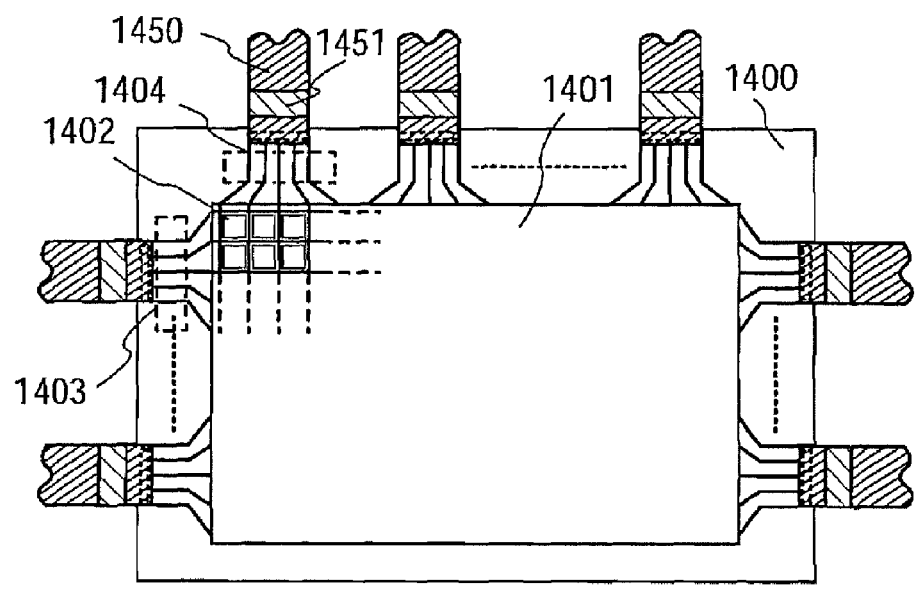
FIGS. 14A and 14B each illustrate a structural example of a conventional display device.
Figure 14B:
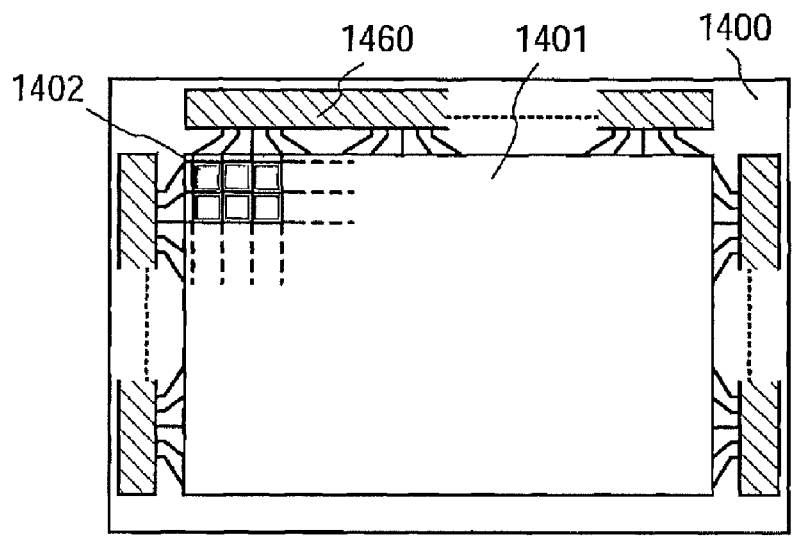

FIG. 13H illustrates a cellular phone, which includes a main body 2701, a housing 2702, a display portion 2703, an audio input portion 2704, an audio output portion 2705, operation keys 2706, an external connection port 2707, an antenna 2708, and the like. A display device of the present invention is used for the display portion 2703. According the present invention, a low-cost and high-performance cellular phone can be provided.

In the above manner, application range of the present invention is extremely wide and the present invention can be applied to electronic apparatuses of every field. Note that this embodiment mode can be combined with any of Embodiment Modes 1 to 3, as appropriate.

The present application is based on Japanese Patent Application serial No. 2007-131590 filed with Japan Patent Office on May 17, 2007, the entire contents of which are hereby incorporated by reference.

What is claimed is:

1. A semiconductor device comprising:
   a first insulating layer and a second insulating layer over an insulating substrate;
   a single-crystal semiconductor layer over the first insulating layer; and
   a non-single-crystal semiconductor layer over the second insulating layer,
   wherein the single-crystal semiconductor layer is used to form a driver circuit portion over the insulating substrate,
   wherein the non-single-crystal semiconductor layer is used to form a circuit of a display portion over the insulating substrate,
   wherein at least one of the first insulating layer and the second insulating layer is formed in a stacked-layer structure,
   wherein a silicon oxynitride layer is formed in contact with the single-crystal semiconductor layer and with the non-single-crystal semiconductor layer, and
   wherein a silicon nitride oxide layer is formed in contact with the silicon oxynitride layer.

2. The semiconductor device according to claim 1, wherein a portion of the stacked-layer structure of the first insulating layer that is in contact with the insulating substrate is a silicon oxide layer.

3. The semiconductor device according to claim 1, wherein a thickness of the single-crystal semiconductor layer is smaller than a thickness of the non-single-crystal semiconductor layer.

4. A display device comprising:
   a first insulating layer and a second insulating layer over an insulating substrate;
   a single-crystal semiconductor layer over the first insulating layer; and
   a non-single-crystal semiconductor layer over the second insulating layer,
   wherein the single-crystal semiconductor layer is used to form a driver circuit portion over the insulating substrate,
   wherein the non-single-crystal semiconductor layer is used to form a circuit of a display portion over the insulating substrate,
   wherein at least one of the first insulating layer and the second insulating layer is formed in a stacked-layer structure,
   wherein a silicon oxynitride layer is formed in contact with the single-crystal semiconductor layer and with the non-single-crystal semiconductor layer, and
   wherein a silicon nitride oxide layer is formed in contact with the silicon oxynitride layer.

5. The display device according to claim 4, wherein a portion of the stacked-layer structure of the first insulating layer that is in contact with the insulating substrate is a silicon oxide layer.

6. The display device according to claim 4, wherein a thickness of the single-crystal semiconductor layer is smaller than a thickness of the non-single-crystal semiconductor layer.

7. The semiconductor device according to claim 1, wherein the semiconductor device is incorporated in one selected from the group consisting of a television receiving device, a camera, a computer, an image reproducing device, an electronic book, and a phone.

8. The display device according to claim 4, wherein the display device is incorporated in one selected from the group consisting of a television receiving device, a camera, a computer, an image reproducing device, an electronic book, and a phone.

9. A semiconductor device comprising:
   a first insulating layer and a second insulating layer over an insulating substrate;
   a single-crystal semiconductor layer over the first insulating layer;

a non-single-crystal semiconductor layer over the second insulating layer;

a first gate insulating layer over the single-crystal semiconductor layer, and a second gate insulating layer over the non-single-crystal semiconductor layer;

a first gate electrode over the first gate insulating layer, and a second gate electrode over the second gate insulating layer;

a third insulating layer over the first gate electrode and the second gate electrode; and a pixel electrode over the third insulating layer, wherein the pixel electrode is electrically connected to the non-single-crystal semiconductor layer, wherein at least one of the first insulating layer and the second insulating layer is formed in a stacked-layer structure, wherein a silicon oxynitride layer is formed in contact with the single-crystal semiconductor layer and with the non-single-crystal semiconductor layer, and wherein a silicon nitride oxide layer is formed in contact with the silicon oxynitride layer.

10. The semiconductor device according to claim 9, wherein a portion of the stacked-layer structure of the first insulating layer that is in contact with the insulating substrate is a silicon oxide layer.

11. The semiconductor device according to claim 9, wherein a thickness of the single-crystal semiconductor layer is smaller than a thickness of the non-single-crystal semiconductor layer.

12. The semiconductor device according to claim 9, wherein the semiconductor device is incorporated in one selected from the group consisting of a television receiving device, a camera, a computer, an image reproducing device, an electronic book, and a phone.

13. A display device comprising:
a first insulating layer and a second insulating layer over an insulating substrate;

a single-crystal semiconductor layer over the first insulating layer;

a non-single-crystal semiconductor layer over the second insulating layer;

a first gate insulating layer over the single-crystal semiconductor layer, and a second gate insulating layer over the non-single-crystal semiconductor layer;

a first gate electrode over the first gate insulating layer, and a second gate electrode over the second gate insulating layer;

a third insulating layer over the first gate electrode and the second gate electrode; and a pixel electrode over the third insulating layer, wherein the pixel electrode is electrically connected to the non-single-crystal semiconductor layer, wherein at least one of the first insulating layer and the second insulating layer is formed in a stacked-layer structure, wherein a silicon oxynitride layer is formed in contact with the single-crystal semiconductor layer and with the non-single-crystal semiconductor layer, and wherein a silicon nitride oxide layer is formed in contact with the silicon oxynitride layer.

14. The display device according to claim 13, wherein a portion of the stacked-layer structure of the first insulating layer that is in contact with the insulating substrate is a silicon oxide layer.

15. The display device according to claim 13, wherein a thickness of the single-crystal semiconductor layer is smaller than a thickness of the non-single-crystal semiconductor layer.

16. The display device according to claim 13, wherein the display device is incorporated in one selected from the group consisting of a television receiving device, a camera, a computer, an image reproducing device, an electronic book, and a phone.

17. The semiconductor device according to claim 1, wherein a sum of thicknesses of the first insulating layer and the single-crystal semiconductor layer is equivalent to a sum of thicknesses of the second insulating layer and the non-single-crystal semiconductor layer.

18. The display device according to claim 4, wherein a sum of thicknesses of the first insulating layer and the single-crystal semiconductor layer is equivalent to a sum of thicknesses of the second insulating layer and the non-single-crystal semiconductor layer.

19. The semiconductor device according to claim 9, wherein a sum of thicknesses of the first insulating layer and the single-crystal semiconductor layer is equivalent to a sum of thicknesses of the second insulating layer and the non-single-crystal semiconductor layer.

20. The display device according to claim 13, wherein a sum of thicknesses of the first insulating layer and the single-crystal semiconductor layer is equivalent to a sum of thicknesses of the second insulating layer and the non-single-crystal semiconductor layer.

* * * * *